(12) United States Patent
Hsu et al.

(10) Patent No.: US 12,183,781 B1
(45) Date of Patent: Dec. 31, 2024

(54) POWER SEMICONDUCTOR PACKAGING AND MANUFACTURING METHOD THEREOF

(71) Applicant: Diodes Incorporated, Plano, TX (US)

(72) Inventors: Chih-Hsiang Hsu, New Taipei (TW); Tao Long, Shanghai (CN); Pin-Hao Huang, New Taipei (TW); Peng Chun Chen, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/732,484

(22) Filed: Jun. 3, 2024

(30) Foreign Application Priority Data

Jan. 31, 2024 (CN) .......................... 202410137256.0

(51) Int. Cl.
| | |
|---|---|
| *H01L 31/0336* | (2006.01) |
| *H01L 29/06* | (2006.01) |
| *H01L 29/08* | (2006.01) |
| *H01L 29/66* | (2006.01) |
| *H01L 29/73* | (2006.01) |
| *H01L 29/739* | (2006.01) |

(52) U.S. Cl.
CPC .... *H01L 29/0607* (2013.01); *H01L 29/66007* (2013.01); *H01L 29/7308* (2013.01)

(58) Field of Classification Search
CPC ............. H01L 29/0607; H01L 29/0615; H01L 29/0623; H01L 29/66007; H01L 29/66068; H01L 29/7308; H01L 29/7811
See application file for complete search history.

(56) References Cited

U.S. PATENT DOCUMENTS

| | | | | |
|---|---|---|---|---|
| 2003/0230767 A1* | 12/2003 | Tihanyi | ............... | H01L 29/7802 257/E29.257 |
| 2022/0013628 A1* | 1/2022 | Shirakawa | .......... | H01L 29/0696 |
| 2022/0181435 A1* | 6/2022 | Suzuki | ............. | H01L 29/66348 |
| 2022/0190105 A1* | 6/2022 | Kim | ................... | H01L 29/7395 |
| 2022/0320271 A1* | 10/2022 | Hou | .................... | H01L 29/0619 |
| 2023/0327013 A1* | 10/2023 | Hsieh | .................... | H01L 29/407 |
| 2024/0096933 A1* | 3/2024 | El Zammar | ......... | H01L 29/7811 |

* cited by examiner

*Primary Examiner* — David C Spalla
(74) *Attorney, Agent, or Firm* — AP3 Law Firm PLLC; Cong Cao

(57) ABSTRACT

The power semiconductor device comprises a base that includes a substrate and an epitaxial layer located above the substrate, with the base comprising a unit area and a peripheral area surrounding the unit area. A junction layer is located within the peripheral area and above the epitaxial layer. A barrier layer is located within the unit area and above the epitaxial layer. A first electrode is located on the junction layer and a second electrode is located on the barrier layer. The epitaxial layer includes a doped channel located within the peripheral area, extending between the junction layer and the base substrate. Current flows from the substrate through the doped channel and the junction layer to the first electrode.

20 Claims, 39 Drawing Sheets

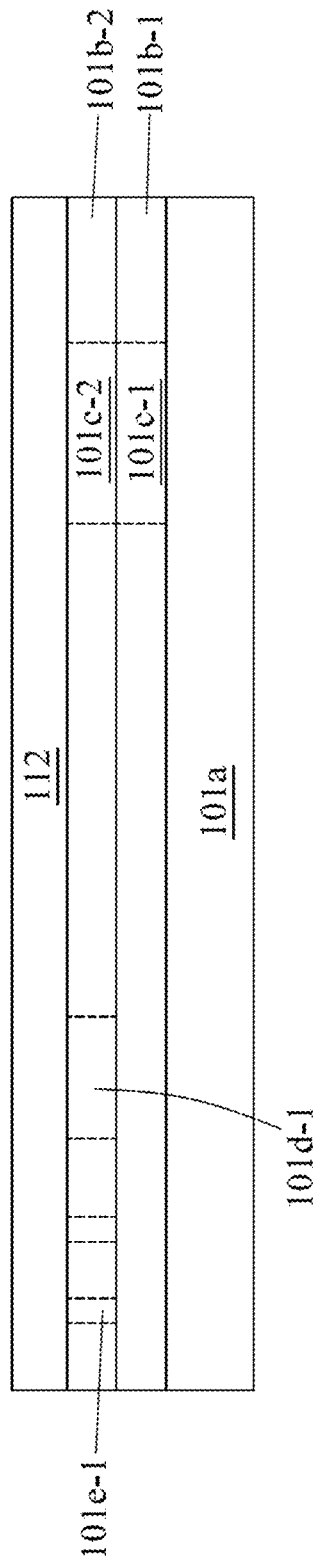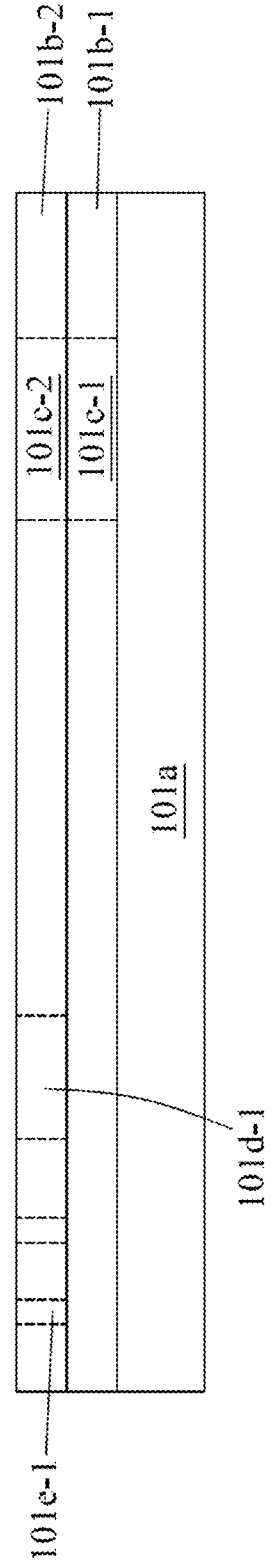
FIG. 18
FIG. 19

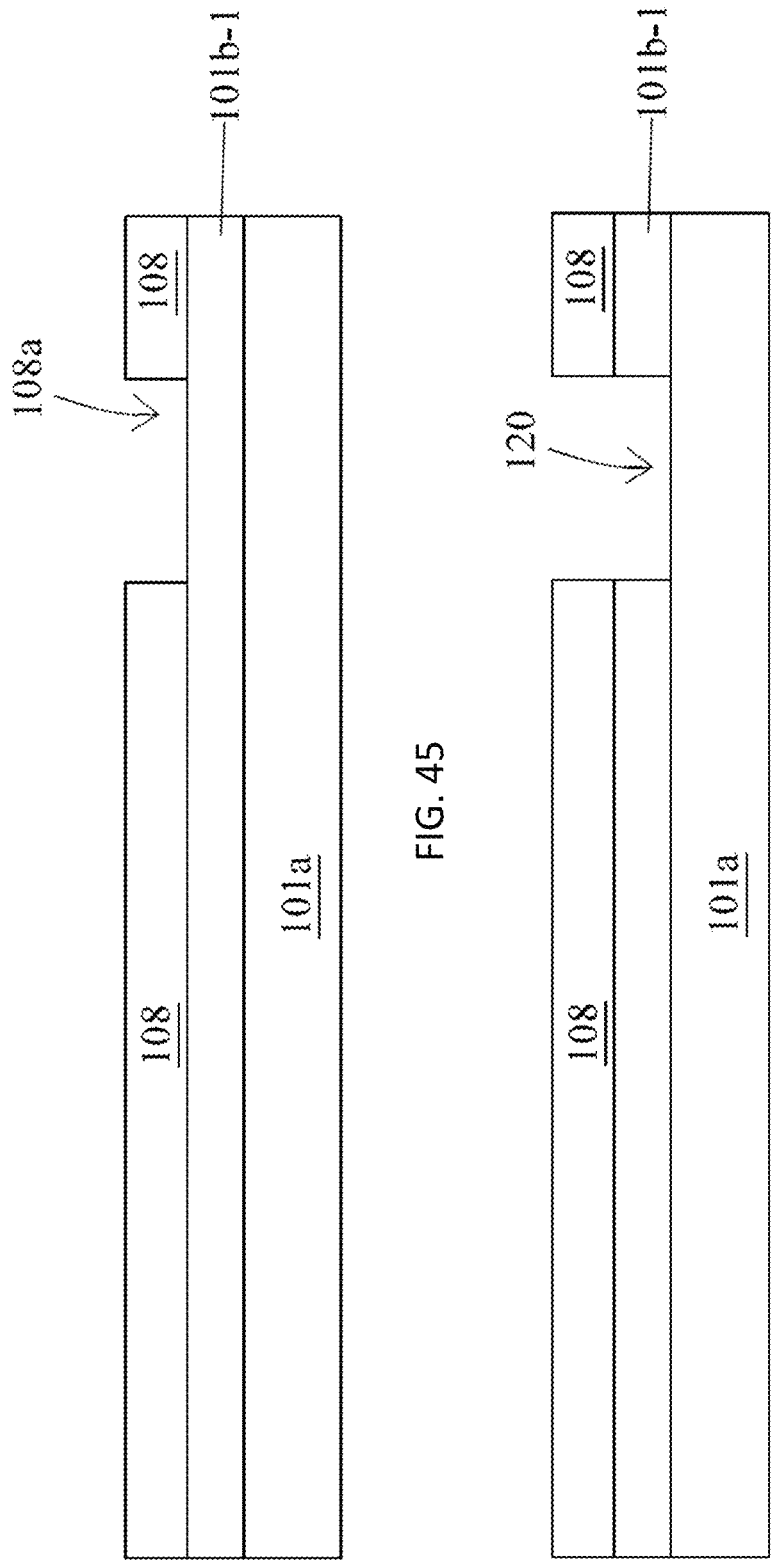

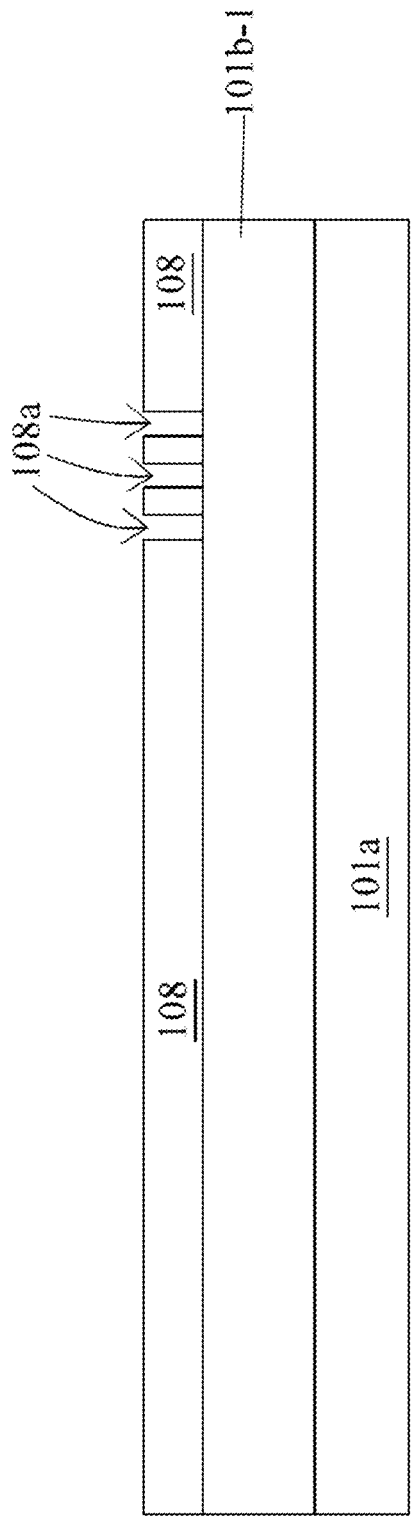
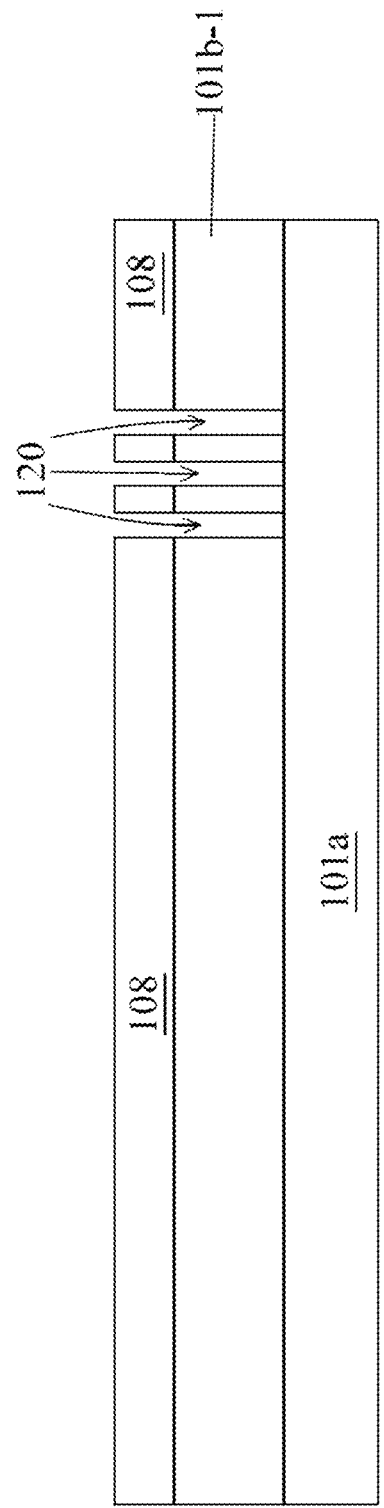
FIG. 50
FIG. 51

POWER SEMICONDUCTOR PACKAGING AND MANUFACTURING METHOD THEREOF

CROSS-REFERENCE TO RELATED APPLICATIONS

This patent application claims priority to Chinese Patent Application No. CN 202410137256.0, filed on Jan. 31, 2024, and entitled "Power Semiconductor Packaging and Manufacturing Method Thereof," which is hereby incorporated by reference herein as if reproduced in its entirety.

TECHNICAL FIELD

The present disclosure relates generally to the field of semiconductor, and in particular embodiments, to power semiconductor packaging and its manufacturing methods. The present disclosure includes embodiments of power semiconductor devices packaged as integrated circuits (ICs) and their corresponding manufacturing methods, more specifically, junction barrier Schottky (JBS) rectifiers packaged at the chip level, known as chip-scale packaging (CSP), along with their manufacturing methods.

BACKGROUND

Modern power circuits require rectifiers that can handle high power, low loss, and rapid switching. Schottky barrier rectifiers are often used when high switching speeds and very low forward bias voltages are needed. Schottky barrier rectifiers are majority carrier devices that utilize Metal-Oxide-Semiconductor (MOS) processes, allowing only a minimal reverse leakage current to flow during the recovery process. Unfortunately, when operating at higher temperatures, Schottky barrier rectifiers suffer from undesirably high reverse leakage currents.

Current improvements aim to enhance the high-temperature operational capabilities of Schottky rectifiers. One such method involves replacing silicon with Silicon Carbide (SiC) as the substrate for Schottky barrier rectifiers, which provides high breakdown voltages, low forward voltage drops, short reverse recovery times, and high-temperature resistance. However, SiC is brittle and prone to wear, making it difficult to machine, which increases manufacturing complexity. Moreover, compared to silicon, SiC leads to greater leakage currents in rectifiers, limiting their use to low voltage applications.

Therefore, there is a need for further improvements in rectifier devices to achieve higher power efficiency and lower losses suitable for fast switching applications.

SUMMARY

Technical advantages are generally achieved, by embodiments of this disclosure which describe innovative power semiconductor packaging and manufacturing methods thereof.

The disclosed embodiments relate to a power semiconductor device. The power semiconductor device comprises a base defining a unit area and a peripheral area surrounding the unit area, which includes a substrate and an epitaxial layer located above the substrate; a junction layer, located within the peripheral area and above the epitaxial layer; a barrier layer, located within the unit area and above the epitaxial layer; a first electrode, located on the junction layer; and a second electrode, located on the barrier layer. The epitaxial layer includes a doped channel located within the peripheral area and extending between the junction layer and the substrate, allowing current to flow from the substrate through the doped channel and the junction layer to the first electrode.

Another embodiment involves a power semiconductor device that comprises: a base defining a unit area and a peripheral area surrounding the unit area, which includes a substrate and an epitaxial layer above the substrate; a semiconductor component, surrounded by the substrate and the epitaxial layer; a junction layer, located within the peripheral area and above the epitaxial layer; and a first electrode, located on the junction layer. The epitaxial layer includes a doped channel located within the peripheral area and extending between the junction layer and the semiconductor component, enabling current to flow from the substrate through the semiconductor component, the doped channel, and the junction layer to the first electrode.

A method for manufacturing a power semiconductor device is also disclosed. The method includes forming a first epitaxial sub-layer above a substrate; implanting doping ions into a portion of the first epitaxial sub-layer to create a first doped sub-channel; forming a second epitaxial sub-layer above the first epitaxial sub-layer; implanting doping ions into a portion of the second epitaxial sub-layer to form a second doped sub-channel above the first doped sub-channel; forming a junction layer above the second doped sub-channel; and forming a first electrode above the junction layer. The formation includes a doped channel comprising the first and second doped sub-channels, which extend between the junction layer and the substrate.

BRIEF DESCRIPTION OF THE DRAWINGS

For a more complete understanding of the present disclosure, and the advantages thereof, reference is now made to the following descriptions taken in conjunction with the accompanying drawings. It is important to acknowledge that the proportional representation of various structures may not be strictly adhered to. In practice, for the sake of elucidation, the dimensions of these structures may be deliberately exaggerated or minimized to enhance clarity in explanation.

FIG. 4 through FIG. 54 depict one or more stages in a manufacturing method of a power semiconductor device in accordance with various embodiments of the present disclosure;

The same or similar components are identified by the same reference numerals throughout the drawings and detailed description. From the detailed description and in conjunction with the drawings, several embodiments of the disclosure will be readily understood.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The following presents numerous exemplary embodiments or examples of various features for implementing the subject matter disclosed herein. Specific instances of components and configurations are described below. However, these are provided solely as examples and are not intended to be limiting. In this disclosure, references to forming a first feature above or on top of a second feature may include embodiments where the first and second features are in direct contact, and may also include embodiments where an additional feature is formed between the first and second features so that they are not in direct contact. Additionally, the disclosure may repeat figure markings and/or letters in various instances. This repetition is for simplicity and clarity and does not indicate a relationship between the discussed embodiments and/or configurations.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood within the scope of this disclosure. It is therefore intended that the appended claims encompass any such modifications or embodiments.

The disclosure provides a power semiconductor packaging and manufacturing method. In contrast to conventional methods of forming a silicon carbide epitaxial layer on a substrate, the power semiconductor device disclosed herein is constructed by sequentially stacking silicon carbide sub-epitaxial layers to form a silicon carbide epitaxial layer. Following the formation of each silicon carbide sub-epitaxial layer, diffusion or ion implantation processes are executed at designated locations to develop a doped channel that extends within the silicon carbide epitaxial layer and is composed of multiple sub-doped channels. This method enables the formation of doped channels in the power semiconductor device without the need for machining the silicon carbide epitaxial layer, thereby circumventing the difficulties associated with the machining of silicon carbide materials. Additionally, this method of sequentially stacking silicon carbide sub-epitaxial layers can produce a thicker silicon carbide epitaxial layer, reducing leakage current, thus allowing the power semiconductor device to be used in high voltage applications.

Figure 1:
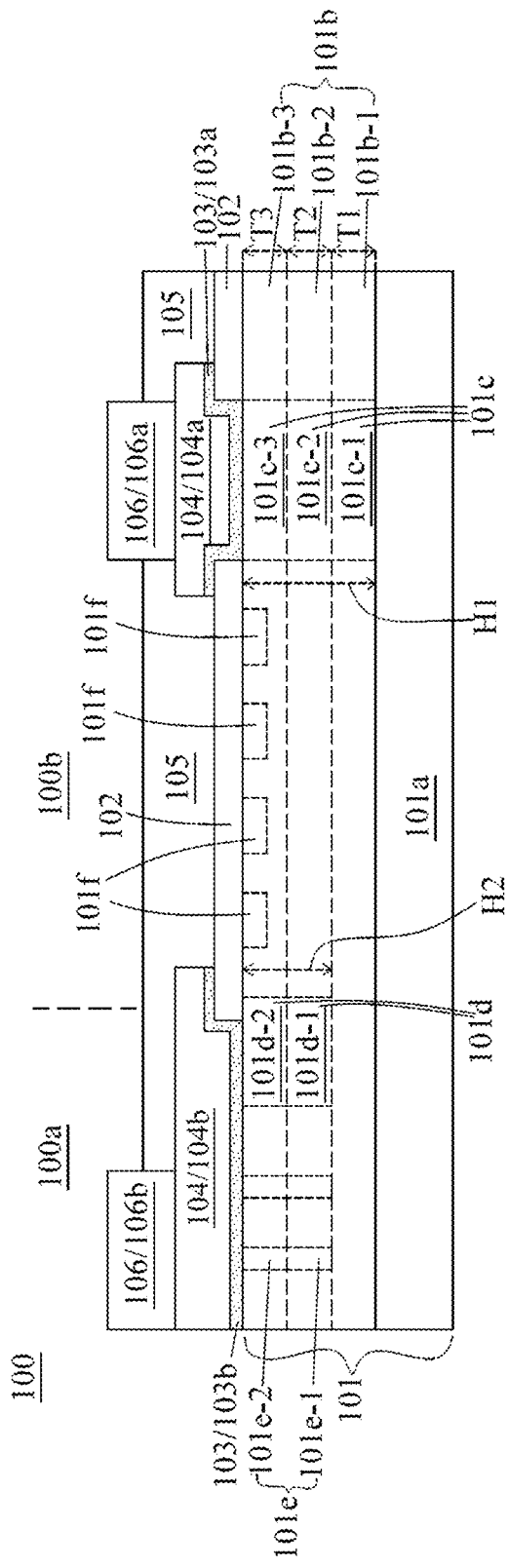
FIG. 1 is a cross-sectional view illustrating an exemplary power semiconductor device in accordance with various embodiments of the present disclosure.

FIG. 1 shows a cross-sectional view of a power semiconductor device 100 in accordance with various embodiments of the present disclosure. Specifically, the power semiconductor device 100 is a power semiconductor device packaged as an integrated circuit (IC). In some embodiments, the power semiconductor device 100 is a Junction Barrier Schottky (JBS) rectifier packaged at the chip level (CSP). As shown in FIG. 1, the power semiconductor device 100 may include a base 101, a contact layer 103 above the base 101, and an electrode 104 above the contact layer 103. From a top view, the base 101 may comprise a unit area 100a and a peripheral area 100b, where the peripheral area 100b is adjacent to the unit area 100a. In some embodiments, the unit area 100a is an active area that houses active or passive components, and the peripheral area 100b is an edge termination area for connection to circuit terminals. In some embodiments, the unit area 100a is surrounded by the peripheral area 100b.

The base 101 may include a substrate 101a and an epitaxial layer 101b above the substrate 101a. In some embodiments, substrate 101a may include semiconductor materials such as silicon, silicon carbide (SiC), germanium (Ge), silicon-germanium (SiGe), gallium nitride (GaN), gallium arsenide (GaAs), and gallium arsenide phosphide (GaAsP), among other semiconductor materials. The epitaxial layer 101b may include semiconductor materials such as silicon, silicon carbide (SiC), germanium (Ge), silicon-germanium (SiGe), gallium nitride (GaN), gallium arsenide (GaAs), gallium arsenide phosphide (GaAsP), among other semiconductor materials. In some embodiments, both the substrate 101a and the epitaxial layer 101b may include materials silicon carbide. In some embodiments, the substrate 101a is an N-type or P-type semiconductor material, and the epitaxial layer 101b is an N-type or P-type semiconductor material. In some embodiments, the substrate 101a and the epitaxial layer 101b have the same type of conductive doping, for example, both the substrate 101a and the epitaxial layer 101b are N-type. In some embodiments, the substrate 101a is part of a silicon carbide wafer. In some embodiments, the doping concentration of the substrate 101a is higher than that of the epitaxial layer 101b. Both the substrate 101a and the epitaxial layer 101b contain N-type dopants, which could be phosphorus (P) or arsenic (As), for example. In some embodiments, the thickness of the epitaxial layer 101b is greater than that of the substrate 101a. In some embodiments, the thickness of the epitaxial layer 101b is greater than or equal to 6 m. The greater the thickness of the epitaxial layer 101b, the better the power semiconductor device 100 performs in high voltage applications (e.g., 650 volts to 3000 volts).

The epitaxial layer 101b includes a doped channel 101c, which is located within the peripheral area 100b and extends between the electrode 104 and the substrate 101a. In some embodiments, the doped channel 101c extends vertically along the thickness of the epitaxial layer 101b. The height H1 of the doped channel 101c may be essentially equal to the thickness of the epitaxial layer 101b. In some embodiments, the height H1 of the doped channel 101c and the thickness of the epitaxial layer 101b are within the approximate range of 2 μm to 6 μm, respectively. The substrate 101a and the doped channel 101c have the same type of conductivity. In some embodiments, the substrate 101a, the epitaxial layer 101b, and the doped channel 101c are all N-type.

The epitaxial layer 101b may include one or more stacked epitaxial sub-layers, such as 101b-1, 101b-2, and 101b-3, with the doped channel 101c extending across these sub-layers. The number of sub-layers can vary, being one or more as required to meet specific design requirements. In some embodiments, the epitaxial layer 101b includes a first epitaxial sub-layer 101b-1, a second epitaxial sub-layer 101b-2, and a third epitaxial sub-layer 101b-3. The first epitaxial sub-layer 101b-1 is positioned above the substrate 101a, the second epitaxial sub-layer 101b-2 is above the first epitaxial sub-layer 101b-1, and the third epitaxial sub-layer 101b-3 is above the second epitaxial sub-layer 101b-2. The first epitaxial sub-layer 101b-1, the second epitaxial sub-layer 101b-2, and the third epitaxial sub-layer 101b-3 have the same type of conductivity, such as all being N-type. The first epitaxial sub-layer 101b-1 has a thickness T1, the second epitaxial sub-layer 101b-2 has a thickness T2, and the third epitaxial sub-layer 101b-3 has a thickness T3. In some embodiments, the thicknesses T1, T2, and T3 may be essentially the same. In some embodiments, the thicknesses T1, T2, and T3 may fall within the range of approximately 1.5 μm to 2 μm.

In some embodiments, the doped channel 101c may include a first doped sub-channel 101c-1, a second doped sub-channel 101c-2, and a third doped sub-channel 101c-3. The first doped sub-channel 101c-1 extends across the first epitaxial sub-layer 101b-1, the second doped sub-channel 101c-2 extends across the second epitaxial sub-layer 101b-2, and the third doped sub-channel 101c-3 extends across the third epitaxial sub-layer 101b-3. The first doped sub-channel 101c-1 is above the substrate 101a, the second doped sub-channel 101c-2 is above the first doped sub-channel 101c-1, and the third doped sub-channel 101c-3 is above the second doped sub-channel 101c-2. The first, second, and third doped sub-channels 101c-1, 101c-2, and 101b-3 have the same type of conductivity, such as all being N-type. In some embodiments, the doping concentration of the first doped sub-channel 101c-1 may be greater than that of the second doped sub-channel 101c-2, which in turn may be greater than that of the third doped sub-channel 101b-3. In some embodiments, the first, second, and third doped sub-channels 101c-1, 101c-2, and 101c-3 may have essentially the same doping concentration.

In some embodiments, the epitaxial layer 101b further includes guard rings 101d and 101f, which are utilized to reduce edge or surface electric fields, thereby enhancing the breakdown voltage of the power semiconductor device 100. The guard rings 101d and 101f function as field limiting rings. The epitaxial layer 101b may comprise a first guard ring 101d positioned between the unit area 100a and the peripheral area 100b, extending across at least a portion of the epitaxial layer 101b to mitigate the effects of high electric fields at the edges of electrode 104. The first guard ring 101d is located near the edge of electrode 104. The first guard ring 101d features a conductivity type that is opposite to that of the epitaxial layer 101b. For example, if the first guard ring 101d is p-type, then the epitaxial layer 101b is n-type. The first guard ring 101d may include p-type dopants such as boron, aluminum, gallium, indium, etc. In some embodiments, the height H2 of the first guard ring 101d may be substantially equal to or less than the thickness of the epitaxial layer 101b. In some embodiments, the height H2 of the first guard ring 101d ranges between approximately 2 μm and 6 μm.

In some embodiments, the first guard ring 101d may include a first guard sub-ring 101d-1 and a second guard sub-ring 101d-2. The first guard sub-ring 101d-1 extends across the second epitaxial sub-layer 101b-2, and the second guard sub-ring 101d-2 extends across the third epitaxial sub-layer 101b-3. The first guard sub-ring 101d-1 is located above the first epitaxial sub-layer 101b-1, and the second guard sub-ring 101d-2 is located above the first guard sub-ring 101d-1. In some embodiments, the first guard ring 101d may further include a third guard sub-ring extending across the first epitaxial sub-layer 101b-1 (not shown in the figures). Both the first and second guard sub-rings 101d-1 and 101d-2 are of the same conductivity type, e.g., p-type. In some embodiments, the doping concentration of the first guard sub-ring 101d-1 is higher than that of the second guard sub-ring 101d-2. In some embodiments, the first and second guard sub-rings 101d-1 and 101d-2 have substantially the same doping concentration.

In some embodiments, the epitaxial layer 101b may also include a second guard ring 101f, positioned within the peripheral area 100b and extending across at least a portion of the epitaxial layer 101b to reduce the impact of surface electric fields. In some embodiments, the second guard ring 101f extends across at least a portion of the third epitaxial sub-layer 101b-3. The second guard ring 101f is positioned between the doped channel 101c and the first guard ring 101d. The second guard ring 101f surrounds the first guard ring 101d as well as the unit area 100a. The second guard ring 101f and the first guard ring 101d are of the same conductivity type, e.g., both are p-type. The second guard ring 101f has a conductivity type opposite to that of the epitaxial layer 101b, for example, if the second guard ring 101f is p-type, then the epitaxial layer 101b is n-type.

In some embodiments, the doping concentration of the second guard ring 101f is less than or equal to that of the first guard ring 101d. In some embodiments, the height of the second guard ring 101f is substantially equal to or less than the thickness T3 of the third epitaxial sub-layer 101b-3. In some embodiments, the height of the second guard ring 101f is equal to or less than approximately 2 μm. In some embodiments, the second guard ring 101f functions as a floating field limiting ring and is not electrically connected to any circuits or components within the unit area 100a.

The epitaxial layer 101b may also include a doped region 101e, positioned within the unit area 100a and extending across at least a portion of the epitaxial layer 101b. The doped region 101e serves as an active area, with electrode 104 strategically positioned above it. In some embodiments, the doped region 101e is surrounded by the first guard ring 101d. The doped region 101e has a conductivity type opposite to that of the epitaxial layer 101b; for instance, if the doped region 101e is p-type, then the epitaxial layer 101b is n-type. The doped region 101e has a conductivity type opposite to that of the doped channel 101c; for instance, if the doped region 101e is p-type, then the doped channel 101c is n-type. The doped region 101e includes p-type dopants such as boron, aluminum, gallium, indium, etc. The deeper the doped region 101e extends into the thickness of the epitaxial layer 101b, the further it can reduce the impact of surface electric fields, thereby lowering the leakage current of the power semiconductor device 100. In some embodiments, the height of the doped region 101e is substantially equal to or less than the thickness of the epitaxial layer 101b. In some embodiments, the height of the doped region 101e ranges between approximately 2 μm and 6 μm.

The doped region 101e may include a first doped sub-region 101e-1 and a second doped sub-region 101e-2. The first doped sub-region 101e-1 extends across the second epitaxial sub-layer 101b-2, and the second doped sub-region 101e-2 extends across the third epitaxial sub-layer 101b-3. The first doped sub-region 101e-1 is located above the first epitaxial sub-layer 101b-1, and the second doped sub-region 101e-2 is located above the first doped sub-region 101e-1. In some embodiments, the doped region 101e may further include a third doped sub-region extending across the first epitaxial sub-layer 101b-1 (not shown in figures). Both the first sub-region 101e-1 and the second doped sub-region 101e-2 are of the same conductivity type, e.g., p-type. The first guard ring 101d, the second guard ring 101f, and the doped region 101e are of the same conductivity type, e.g., all are p-type. In some embodiments, the first doped sub-region 101e-1 and the second doped sub-region 101e-2 have substantially the same doping concentration. In some embodiments, the doping concentration of the first doped sub-region 101e-1 is greater than that of the second doped sub-region 101e-2.

The power semiconductor device 100 may also include a dielectric layer 102, positioned above the base 101. The dielectric layer 102 is located above the epitaxial layer 101b and surrounds at least a portion of the contact layer 103 and at least a portion of electrode 104. In some embodiments, the dielectric layer 102 covers at least a portion of the second guard ring 101f and the first guard ring 101d. In some embodiments, the dielectric layer 102 may comprise insulating materials such as oxide, nitride, or oxynitride. In some embodiments, the dielectric layer 102 may comprise silica. In some embodiments, the dielectric layer 102 may be a field oxide.

The contact layer 103 may include a junction layer 103a and a barrier layer 103b. The junction layer 103a is located within the peripheral area 100b and above the epitaxial layer 101b. In some embodiments, at least a portion of the junction layer 103a is surrounded by the dielectric layer 102, and at least a portion of the junction layer 103a is above the dielectric layer 102. The junction layer 103a contacts at least a portion of the epitaxial layer 101b. The junction layer 103a contacts at least a portion of the doped channel 101c. In some embodiments, the junction layer 103a contacts the third doped channel 101c-3. The doped channel 101c extends between the junction layer 103a and the substrate 101a. In some embodiments, an ohmic or non-ohmic contact is formed between the junction layer 103a and the doped channel 101c, allowing current to flow from the junction layer 103a to the doped channel 101c, or from the doped channel 101c to the junction layer 103a. In some embodiments, the junction layer 103a may include a metal material, such as aluminum (Al), copper (Cu), titanium (Ti), nickel (Ni), tungsten (W), molybdenum (Mo), etc. In some embodiments, the junction layer 103a is ohmic or non-ohmic.

The barrier layer 103b is positioned within the unit area 100a and above the epitaxial layer 101b. In some embodiments, at least a portion of the barrier layer 103b is surrounded by the dielectric layer 102, and at least a portion of the barrier layer 103b is above the dielectric layer 102. The barrier layer 103b contacts at least a portion of the epitaxial layer 101b. The doped region 101e extends between the barrier layer 103b and the substrate 101a. The barrier layer 103b contacts at least a portion of the barrier layer 101e. In some embodiments, the barrier layer 103b contacts the second doped sub-region 101e-2. In some embodiments, a Schottky contact or non-ohmic contact is formed between the barrier layer 103b and the doped region 101e, allowing current to flow from the barrier layer 103b to the doped region 101e. In some embodiments, current essentially cannot flow from the doped region 101e to the barrier layer 103b. In some embodiments, the barrier layer 103b may include metal materials such as platinum (Pt), titanium (Ti), nickel (Ni), gold (Au), etc. In some embodiments, the barrier layer 103b is non-ohmic. In some embodiments, the barrier layer 103b is a Schottky metal. The barrier layer 103b contacts at least a portion of the first guard ring 101d. In some embodiments, the barrier layer 103b contacts the second guard sub-ring 101d-2. The first guard ring 101d extends between the barrier layer 103b and the substrate 101a.

The electrode 104 may include a first electrode 104a and a second electrode 104b. The first electrode 104a is positioned on the junction layer 103a, and the second electrode 104b is positioned on the barrier layer 103b. In some embodiments, both the first electrode 104a and the second electrode 104b are positioned on the upper side of the power semiconductor device 100. In some embodiments, both the first electrode 104a and the second electrode 104b are positioned on the same side of the power semiconductor device 100. The first electrode 104a is positioned within the peripheral area 100b, and the second electrode 104b is positioned within the unit area 100a. In some embodiments, at least a portion of the first electrode 104a and at least a portion of the second electrode 104b are surrounded by the dielectric layer 102, and at least a portion of the first electrode 104a and at least a portion of the second electrode 104b are above the dielectric layer 102. The first electrode 104a contacts at least a portion of the junction layer 103a. The second electrode 104b contacts at least a portion of the barrier layer 103b. In some embodiments, the first electrode 104a and the second electrode 104b may each include conductive materials, such as metal materials like copper (Cu), silver (Ag), gold (Au), etc. In some embodiments, current may flow from the substrate 101a through the doped channel 101c and the junction layer 103a to the first electrode 104a. In some embodiments, current may flow from the second electrode 104b through the doped region 101e and the barrier layer 103b to the substrate 101a. In some embodiments, current may flow from the second electrode 104b through the barrier layer 103b, the doped region 101e, the substrate 101a, the doped channel 101c, and the junction layer 103a to the first electrode 104a. In some embodiments, the first electrode 104a is the cathode or negative pole, and the second electrode 104b is the anode or positive pole.

The power semiconductor device 100 may also include a passivation layer 105, which is positioned above the dielectric layer 102, the first electrode 104a, and the second electrode 104b. In some embodiments, the passivation layer 105 may include insulating materials, such as polymers, polyimide (PI), oxides, nitrides, oxynitrides, etc. In some embodiments, at least a portion of the first electrode 104a and at least a portion of the second electrode 104b are exposed by the passivation layer 105. The dielectric layer 102 and the passivation layer 105 separate the junction layer 103a and the first electrode 104a from the barrier layer 103b and the second electrode 104b.

The power semiconductor device 100 may also include multiple conductive bumps 106, which are individually positioned above the electrode 104. The multiple conductive bumps 106 are surrounded by the passivation layer 105. In some embodiments, the conductive bumps 106 may include conductive materials, such as tin, lead, silver, copper, nickel, etc. In some embodiments, the conductive bumps 106 may be solder balls or tin balls. The conductive bumps 106 can electrically connect the power semiconductor device 100 to external circuits or components, enabling external electrical connections for the power semiconductor device 100. In some embodiments, the multiple conductive bumps 106 include a first conductive bump 106a and a second conductive bump 106b. The first conductive bump 106a is positioned within the peripheral area 100b, and the second conductive bump 106b is positioned within the unit area 100a. The first conductive bump 106a is positioned above the first electrode 104a, and the second conductive bump 106b is positioned above the second electrode 104b. In some embodiments, the first conductive bump 106a is positioned above at least a portion of the first electrode 104a exposed by the passivation layer 105, and the second conductive bump 106b is positioned above at least a portion of the second electrode 104b exposed by the passivation layer 105. The first conductive bump 106a is electrically connected to the first electrode 104a, and the second conductive bump 106b is electrically connected to the second electrode 104b. The first conductive bump 106a and the second conductive bump 106b are separated by the passivation layer 105. In some embodiments, the power semiconductor device 100 may not include multiple conductive bumps 106; for example, the multiple conductive bumps 106 may be replaced by wire bonds that contact the electrode 104.

In some embodiments, the epitaxial layer 101b of the power semiconductor device 100 may be formed by stacking multiple sub-epitaxial layers 101b-1, 101b-2, and 101b-3. This configuration enables a thicker epitaxial layer 101b, which reduces the leakage current of the power semiconductor device 100 and allows its use in high voltage applications.

Figure 2:
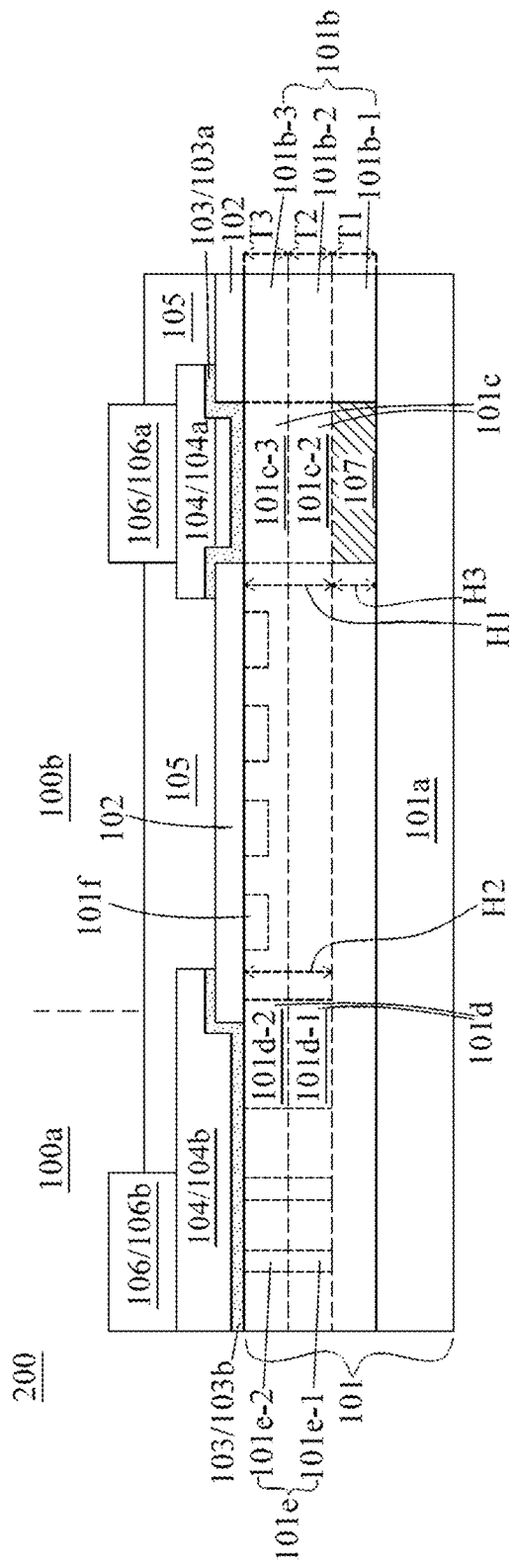
FIG. 2 is a cross-sectional view illustrating another exemplary power semiconductor device in accordance with various embodiments of the present disclosure.

FIG. 2 is a cross-sectional view of another power semiconductor device 200, according to virous embodiments of the present disclosure. Specifically, the power semiconductor device 200 includes features similar to the power semiconductor device 100 shown in FIG. 1, with the distinction that the power semiconductor device 200 additionally comprises a semiconductor component 107 positioned between the doped channel 101c and the substrate 101a, and extending therebetween. The semiconductor component 107 is surrounded by the substrate 101a and the epitaxial layer 101b and extends through a portion of the epitaxial layer 101b. The semiconductor component 107 is located within the peripheral area 100b, with the doped channel 101c extending between the contact layer 103a and the semiconductor component 107. Current may flow from the substrate 101a through the semiconductor component 107, the doped channel 101c, and the contact layer 103a to the first electrode 104a. In some embodiments, the semiconductor component 107 may comprise a semiconductor material such as polysilicon. The semiconductor component 107 is not involved in diffusion or ion implantation processes. Compared to the power semiconductor device 100, the power semiconductor device 200, which includes the semiconductor component 107, reduces the diffusion or ion implantation processes, thereby lowering the thermal budget of the power semiconductor device 200 and enhancing its reliability.

In some embodiments, the semiconductor component 107 is surrounded by the first epitaxial sub-layer 101b-1 and extends through the first epitaxial sub-layer 101b-1. In some embodiments, the height H3 of the semiconductor component 107 is substantially less than or equal to the height H1 of the doped channel 101c. In some embodiments, the height H3 of the semiconductor component 107 is substantially less than or equal to the thickness T1 of the first epitaxial sub-layer 101b-1. In some embodiments, the height H3 of the semiconductor component 107 is about 2 μm.

In some embodiments, the semiconductor component 107 may be surrounded by the first epitaxial sub-layers 101b-1 and the second epitaxial sub-layers 101b-2, and it extends through both the first epitaxial sub-layers 101b-1 and the second epitaxial sub-layers 101b-2. In some embodiments, the height H3 of the semiconductor component 107 is substantially greater than or equal to the height H1 of the doped channel 101c. In some embodiments, the height H3 of the semiconductor component 107 is substantially greater than the thickness T1 of the first epitaxial sub-layer 101b-1. In some embodiments, the height H3 of the semiconductor component 107 is substantially greater than the thickness T2 of the second epitaxial sub-layer 101b-2. In some embodiments, the height H3 of the semiconductor component 107 may be greater than 2 μm.

Figure 3:
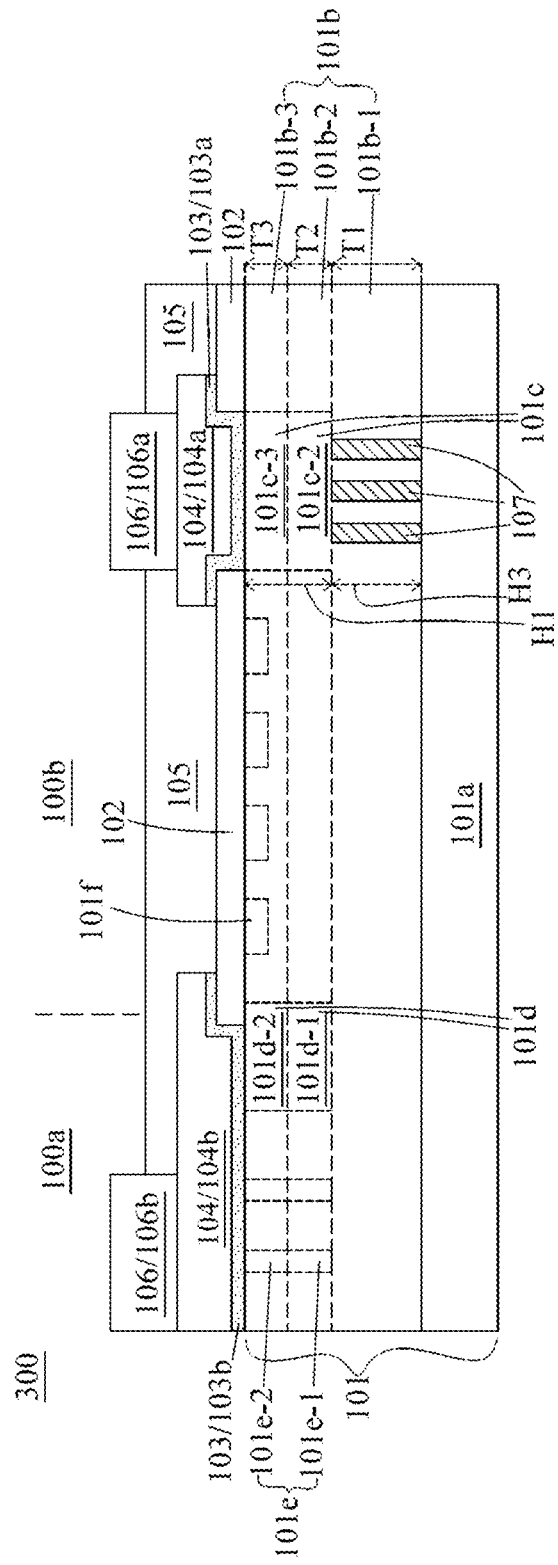
FIG. 3 is a cross-sectional view illustrating another exemplary power semiconductor device in accordance with various embodiments of the present disclosure.

FIG. 3 is a cross-sectional view of another power semiconductor device 300, according to various embodiments of the present disclosure. Specifically, the power semiconductor device 300 includes features similar to those in the power semiconductor device 200 shown in FIG. 2, but with a distinction that the semiconductor component 107 comprises multiple components. At least a portion of the epitaxial layer 101b is positioned between two adjacent components of the semiconductor component 107, and at least a portion of the epitaxial layer 101b extends between the doped channel 101c and the substrate 101a, surrounded by multiple components of the semiconductor component 107. In some embodiments, the height H3 of the semiconductor component 107 is substantially greater than or equal to the height H1 of the doped channel 101c. In some embodiments, the height H3 of the semiconductor component 107 is substantially equal to the thickness T1 of the first epitaxial sub-layer 101b-1. In some embodiments, the thickness T1 of the first epitaxial sub-layer 101b-1 is substantially greater than the thickness T2 of the second epitaxial sub-layer 101b-2 or the thickness T3 of the third epitaxial sub-layer 101b-3. In some embodiments, the height H3 of the semiconductor component 107 is substantially greater than or equal to 5 μm. Compared to the semiconductor component 107 in power semiconductor device 200, each component of the semiconductor component 107 in power semiconductor device 300 has a higher aspect ratio, which achieves better uniformity when filling semiconductor material between layers of the epitaxial layer 101b, thus forming better and more reliable components of semiconductor component 107.

FIGS. 4 to 44 illustrate one or more stages in the manufacturing method of the power semiconductor device 100, according to various embodiments of the present disclosure. Some of these figures have been simplified for a better understanding of the disclosures presented here.

Figure 4:
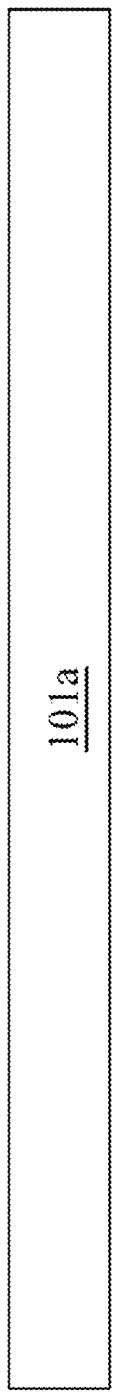
Figure 5:
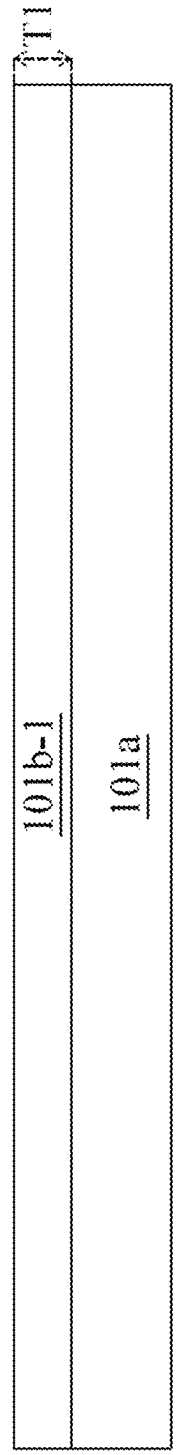

Referring to FIGS. 4 to 5, the manufacturing method includes forming the first epitaxial sub-layer 101b-1 above the substrate 101a. Epitaxial growth is performed on the substrate 101a to form the first epitaxial sub-layer 101b-1. In some embodiments, the substrate 101a and the first epitaxial sub-layer 101b-1 have the same conductivity type doping, such as both being n-type. In some embodiments, ion implantation may be carried out simultaneously with epitaxial growth, injecting ions with n-type electrical properties, such as phosphorus (P) or arsenic (As), to form an n-type first epitaxial sub-layer 101b-1. In some embodiments, both the substrate 101a and the first epitaxial sub-layer 101b-1 may include silicon carbide. In some embodiments, the first epitaxial sub-layer 101b-1 has a thickness T1, with the thickness T1 ranging between approximately 1.5 μm and 2 μm.

Figure 6:
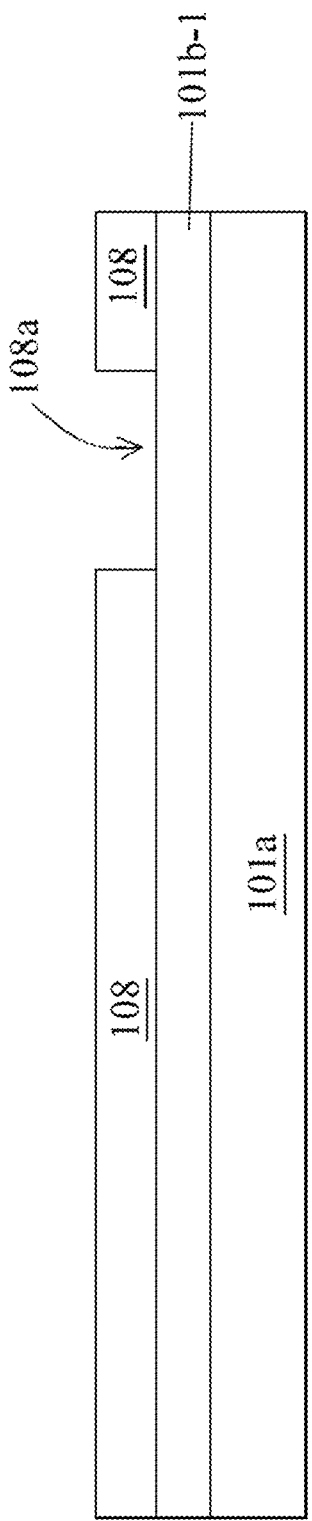
Figure 7:
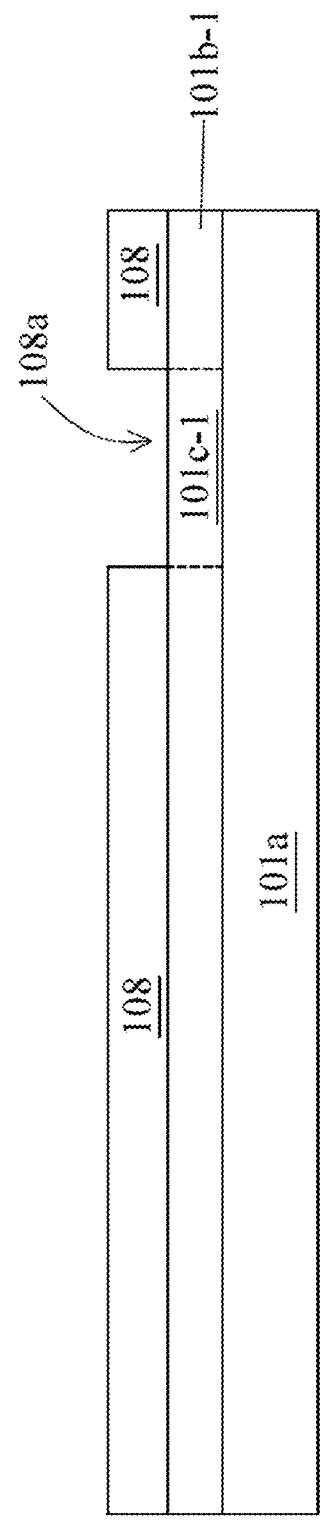
Figure 8:
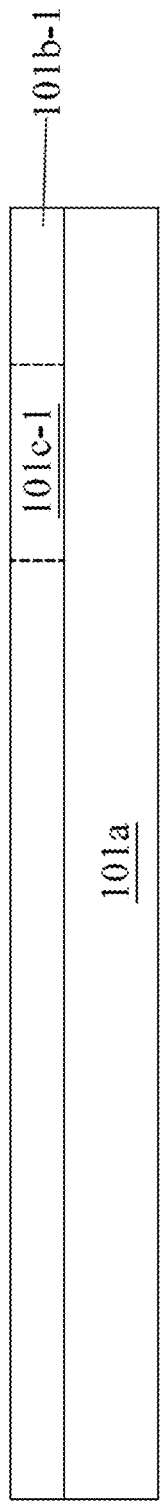
Figure 9:
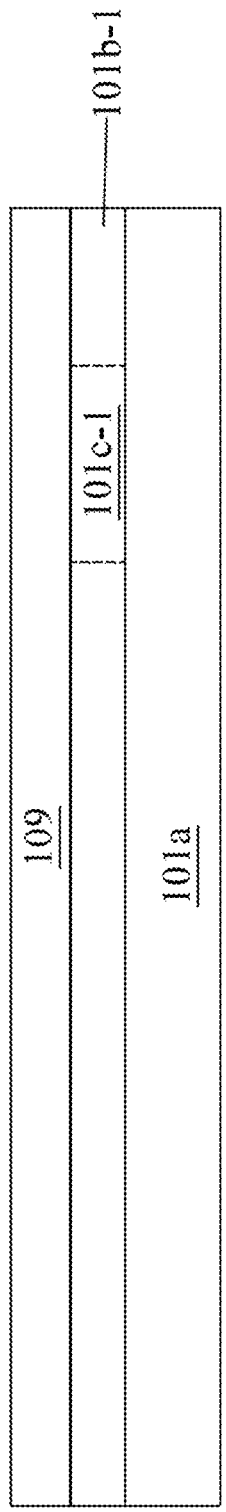
Figure 10:
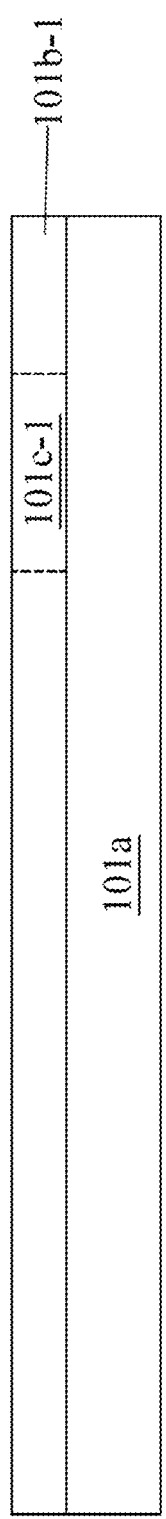

Referring to FIGS. 6 to 10, the manufacturing method includes implanting doping ions into a portion of the first epitaxial sub-layer 101b-1 to form the first doped channel 101c-1. Referring to FIG. 6, the first patterned masking layer 108 is formed on the first epitaxial sub-layer 101b-1 to define the location of the first doped channel 101c-1. In some embodiments, the first patterned masking layer 108 may include materials such as photoresist or oxides. The first patterned masking layer 108 features a first opening 108a that exposes a portion of the first epitaxial sub-layer 101b-1, forming the first doped channel 101c-1. Referring to FIG. 7, the first doped channel 101c-1 can be formed by diffusion or ion implantation processes carried out from the surface of the first epitaxial sub-layer 101b-1 exposed at the first opening 108a. The substrate 101a, the first epitaxial sub-layer 101b-1, and the first doped channel 101c-1 have the same conductivity type. In some embodiments, doping ions such as phosphorus ions or arsenic ions are injected from the surface of the first epitaxial sub-layer 101b-1 exposed at the first opening 108a to form the first doped channel 101c-1. Referring to FIG. 8, after the diffusion or ion implantation processes, the first patterned masking layer 108 is removed. In some embodiments, an etching process, such as plasma dry etching, is carried out to remove the first patterned masking layer 108. Referring to FIG. 9, after the removal of the first patterned masking layer 108, the first protective layer 109 is formed on the first epitaxial sub-layer 101b-1 to protect the first epitaxial sub-layer 101b-1 and the first doped channel 101c-1 during the annealing process. In some embodiments, the first protective layer 109 may include carbon. After forming the first protective layer 109, the first doped channel 101c-1 undergoes an annealing process, such as rapid thermal annealing (RTA) or laser annealing, to activate the doping ions in the first doped channel 101c-1. Referring to FIG. 10, after the annealing process, the first protective layer 109 may be removed through processes such as dry thermal oxidation, plasma etching, or other etching techniques.

Figure 11:
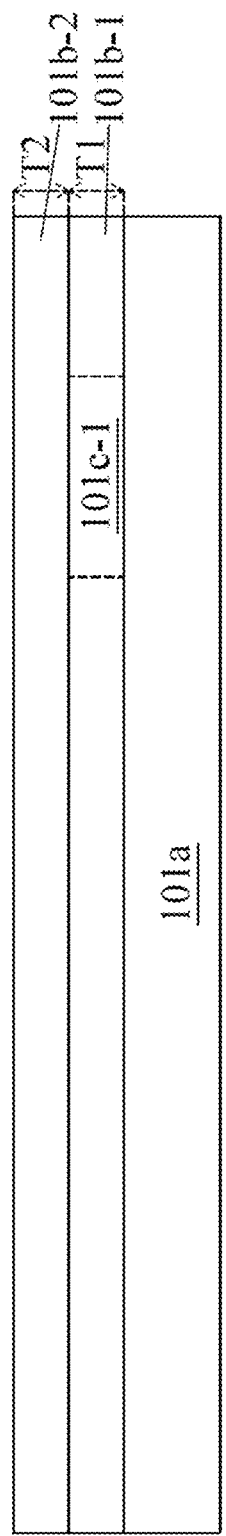

Referring to FIG. 11, the manufacturing method may also include forming the second epitaxial sub-layer 101b-2 above the first epitaxial sub-layer 101b-1. Epitaxial growth is performed above the first epitaxial sub-layer 101b-1 to form the second epitaxial sub-layer 101b-2. In some embodiments, the substrate 101a, the first epitaxial sub-layer 101b-1, and the second epitaxial sub-layer 101b-2 have the same conductivity type doping, such as the second epitaxial sub-layer 101b-2 and the first epitaxial sub-layer 101b-1 both being n-type. In some embodiments, ion implantation may be carried out simultaneously with epitaxial growth, injecting ions with n-type electrical properties, such as phosphorus (P) or arsenic (As), to form an n-type second epitaxial sub-layer 101b-2. In some embodiments, the substrate 101a, the first epitaxial sub-layer 101b-1, and the second epitaxial sub-layer 101b-2 may all include silicon carbide. In some embodiments, the first epitaxial sub-layer 101b-1 has a thickness T1 and the second epitaxial sub-layer 101b-2 has a thickness T2, with the thickness T1 and thickness T2 being substantially the same, ranging between approximately 1.5 μm and 2 μm.

Figure 12:
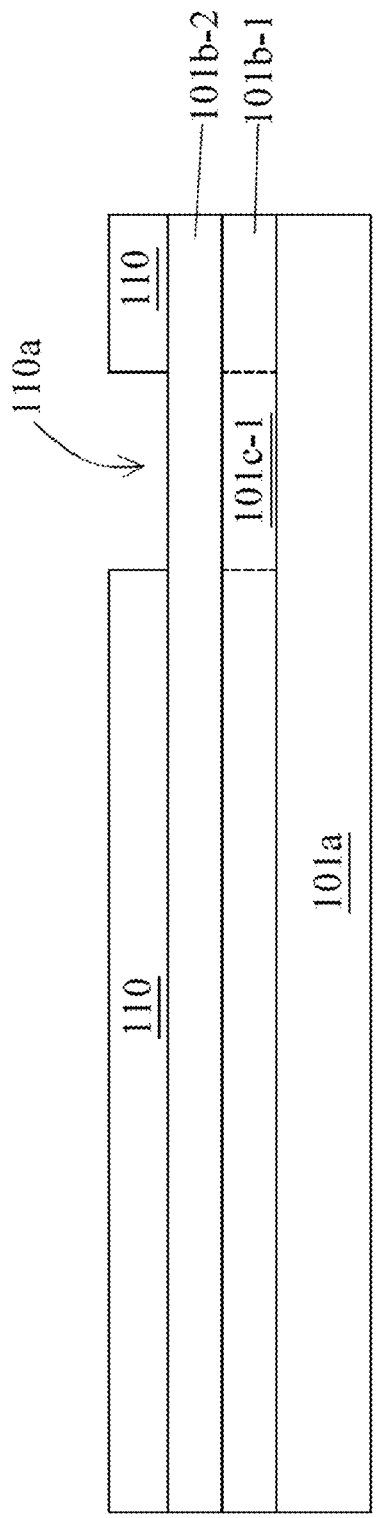
Figure 13:
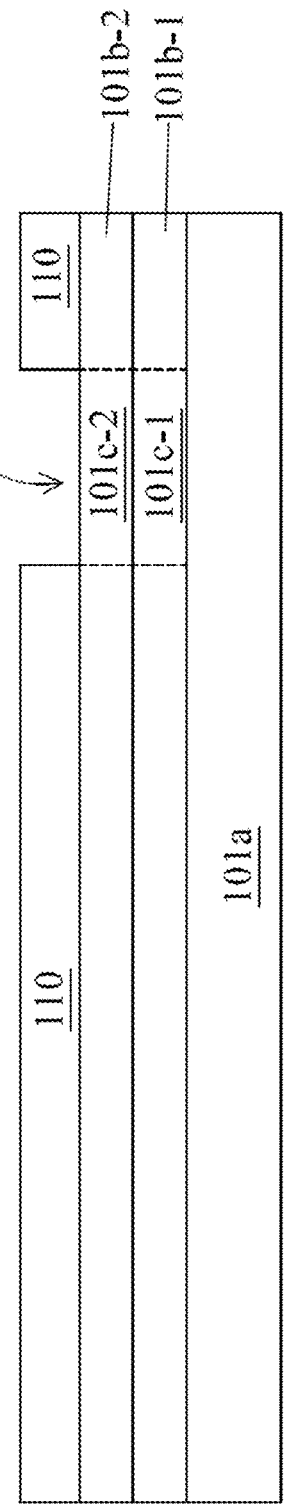
Figure 14:
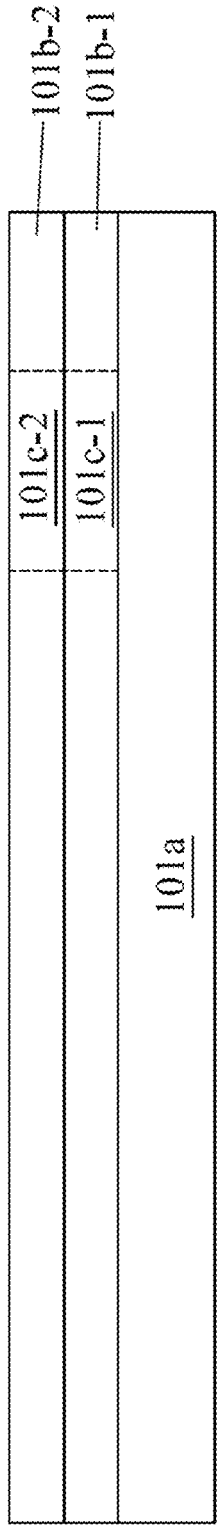

Referring to FIGS. 12 to 14, the manufacturing method may include injecting the doping ions into a portion of the second epitaxial sub-layer 101b-2 to form the second doped channel 101c-2 above the first doped channel 101c-1. Referring to FIG. 12, the second patterned masking layer 110 is formed above the second epitaxial sub-layer 101b-2 to define the location of the second doped channel 101c-2. In some embodiments, the second patterned masking layer 110 may contain photoresist or oxides. The second patterned masking layer 110 features a second opening 110a, through which a portion of the second epitaxial sub-layer 101b-2, exposed at the second opening 110a, forms the second doped channel 101c-2. Referring to FIG. 13, the second doped channel 101c-2 can be formed by diffusion or ion implantation processes carried out from the surface of the second epitaxial sub-layer 101b-2 exposed at the second opening 110a. The second epitaxial sub-layer 101b-2 and the second doped channel 101c-2 have the same conductivity type. In some embodiments, doping ions such as phosphorus ions or arsenic ions are injected from the surface of the second epitaxial sub-layer 101b-2 exposed at the second opening 110a to form the second doped channel 101c-2. In some embodiments, the doping concentration of the first doped sub-channel 101c-1 is greater than the doping concentration of the second doped sub-channel 101c-2.

Referring to FIG. 14, after the diffusion or ion implantation processes, the second patterned masking layer 110 is removed. In some embodiments, an etching process, such as plasma dry etching, is carried out to remove the second patterned masking layer 110.

Figure 15:
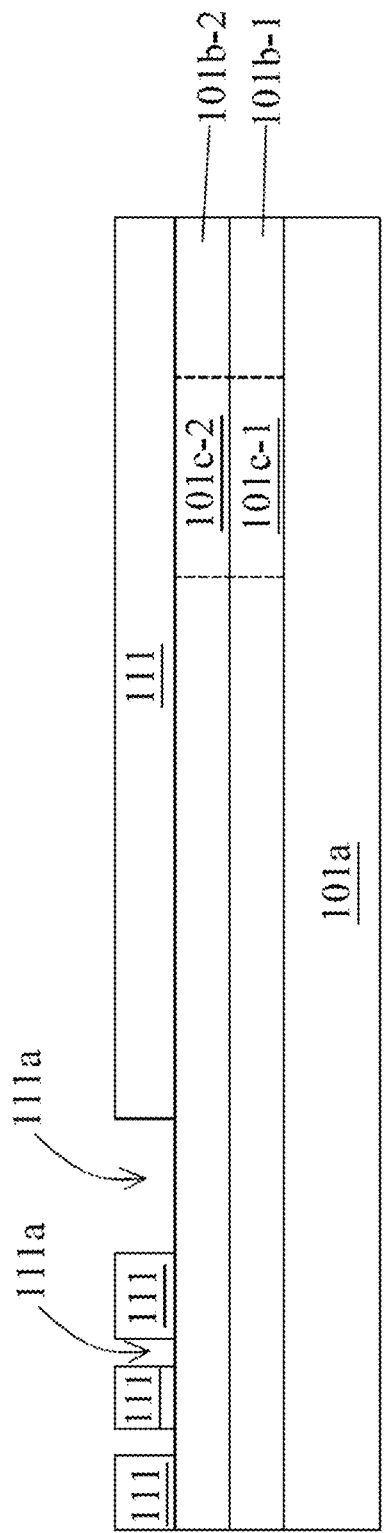
Figure 16:
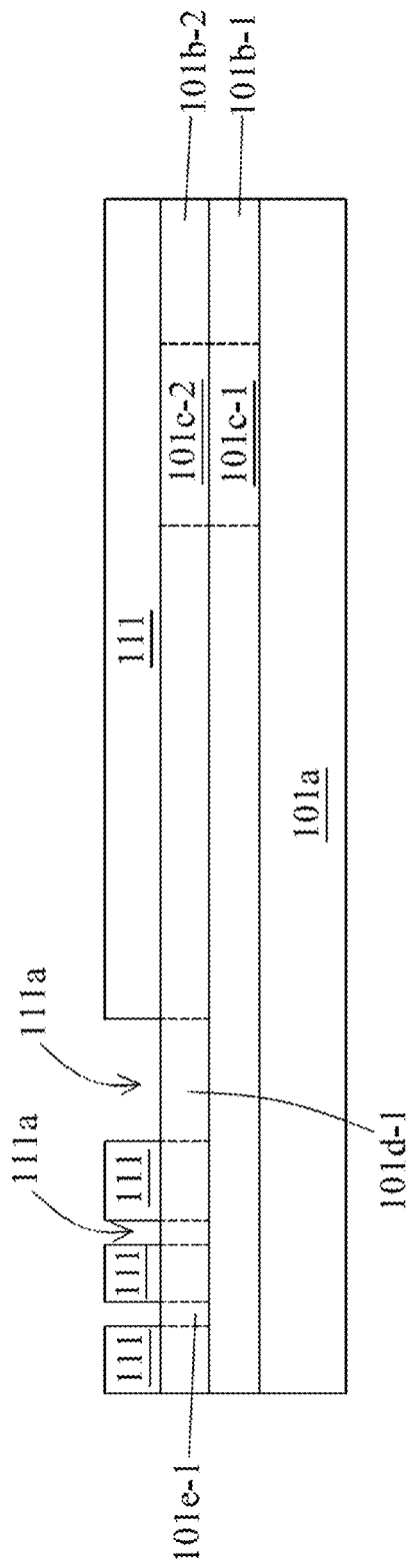
Figure 17:
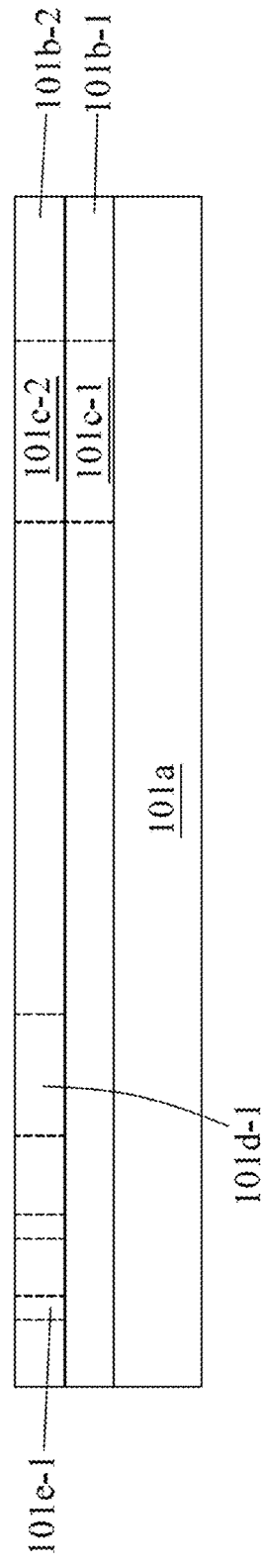

In some embodiments, referring to FIG. 15, after the removal of the second patterned masking layer 110, the third patterned masking layer 111 is formed on the second epitaxial sub-layer 101b-2 to define the locations of the first guard sub-ring 101d-1 and the first doped sub-region 101e-1. In some embodiments, the third patterned masking layer 111 contains photoresist or oxides. The third patterned masking layer 111 features a third opening 111a, which may include multiple sub-openings, through which portions of the second epitaxial sub-layer 101b-2 exposed at these sub-openings form the first guard sub-ring 101d-1 and the first doped sub-region 101e-1. Referring to FIG. 16, the first guard sub-ring 101d-1 and the first doped sub-region 101e-1 can be formed by diffusion or ion implantation processes carried out from the surface of the second epitaxial sub-layer 101b-2 exposed at the third opening 111a. The first guard sub-ring 101d-1 and the first doped sub-region 101e-1 have the same conductivity type, such as both being p-type. P-type dopants can include, for example, boron, aluminum, gallium, indium, etc. In some embodiments, doping ions such as boron ions may be injected from the surface of the second epitaxial sub-layer 101b-2 exposed at the third opening 111a to form the first guard sub-ring 101d-1 and the first doped sub-region 101e-1. Referring to FIG. 17, after the diffusion or ion implantation processes, the third patterned masking layer 111 is removed. In some embodiments, an etching process, such as plasma dry etching, is carried out to remove the third patterned masking layer 111.

Referring to FIG. 18, after the removal of the third patterned masking layer 111, the second protective layer 112 is formed on the second epitaxial sub-layer 101b-2 to protect the second epitaxial sub-layer 101b-2, the first guard sub-ring 101d-1, the first doped sub-region 101e-1, and the second doped channel 101c-2 during the annealing process. After forming the second protective layer 112, the first guard sub-ring 101d-1, the first doped sub-region 101e-1, and the second doped channel 101c-2 undergo an annealing process, such as rapid thermal annealing (RTA) or laser annealing, to activate the doping ions in the first guard sub-ring 101d-1, the first doped sub-region 101e-1, and the second doped channel 101c-2. Referring to FIG. 19, after the annealing process, an etching process, such as plasma dry etching, is carried out to remove the second protective layer 112.

Figure 20:
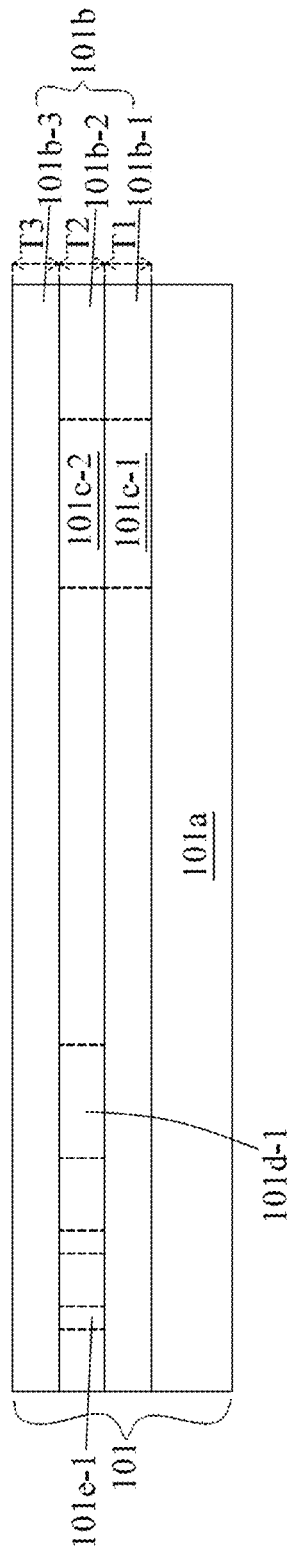

In some embodiments, referring to FIG. 20, the manufacturing method may include forming the third epitaxial sub-layer 101b-3 above the second epitaxial sub-layer 101b-2. Epitaxial growth is performed above the second epitaxial sub-layer 101b-2 to form the third epitaxial sub-layer 101b-3. In some embodiments, the substrate 101a, the first epitaxial sub-layer 101b-1, the second epitaxial sub-layer 101b-2, and the third epitaxial sub-layer 101b-3 have the same conductivity type doping, such as the first epitaxial sub-layer 101b-1, the second epitaxial sub-layer 101b-2, and the third epitaxial sub-layer 101b-3 all being n-type. In some embodiments, ion implantation is carried out simultaneously with epitaxial growth, injecting ions with n-type electrical properties, such as phosphorus (P) or arsenic (As), to form an n-type third epitaxial sub-layer 101b-3. In some embodiments, the substrate 101a, the first epitaxial sub-layer 101b-1, the second epitaxial sub-layer 101b-2, and the third epitaxial sub-layer 101b-3 may all include silicon carbide. In some embodiments, the third epitaxial sub-layer 101b-3 has a thickness T3, with the thicknesses T1, T2, and T3 being substantially the same, and the thickness T3 ranging between approximately 1.5 µm and 2 µm. In some embodiments, the epitaxial layer 101b is composed of the first epitaxial sub-layer 101b-1, the second epitaxial sub-layer 101b-2, and the third epitaxial sub-layer 101b-3, with the substrate 101a and the combined epitaxial layers collectively forming the base 101.

Figure 21:
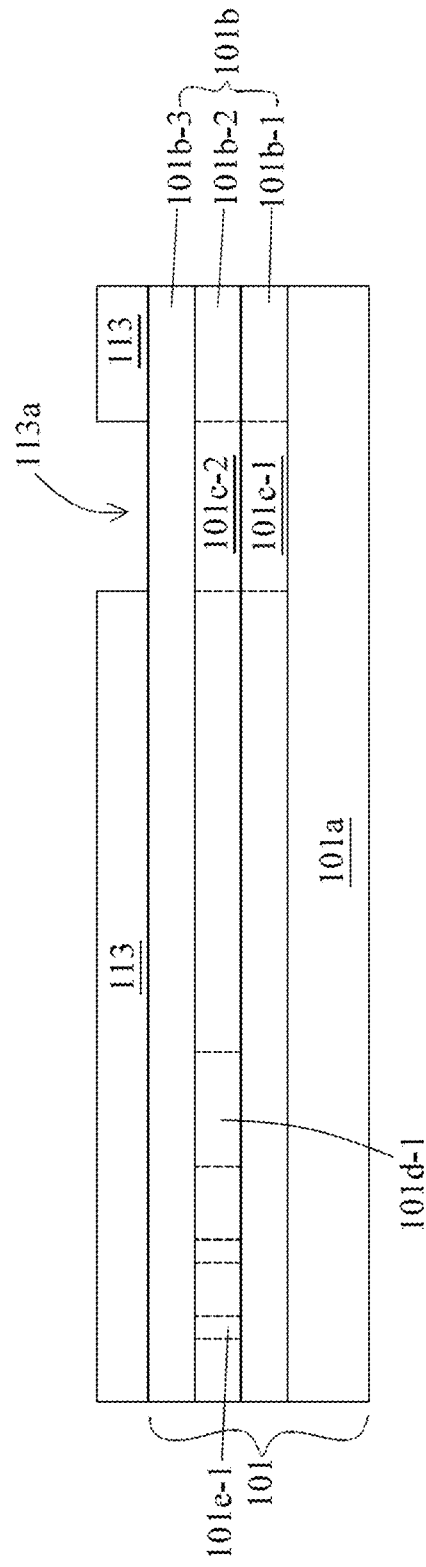
Figure 22:
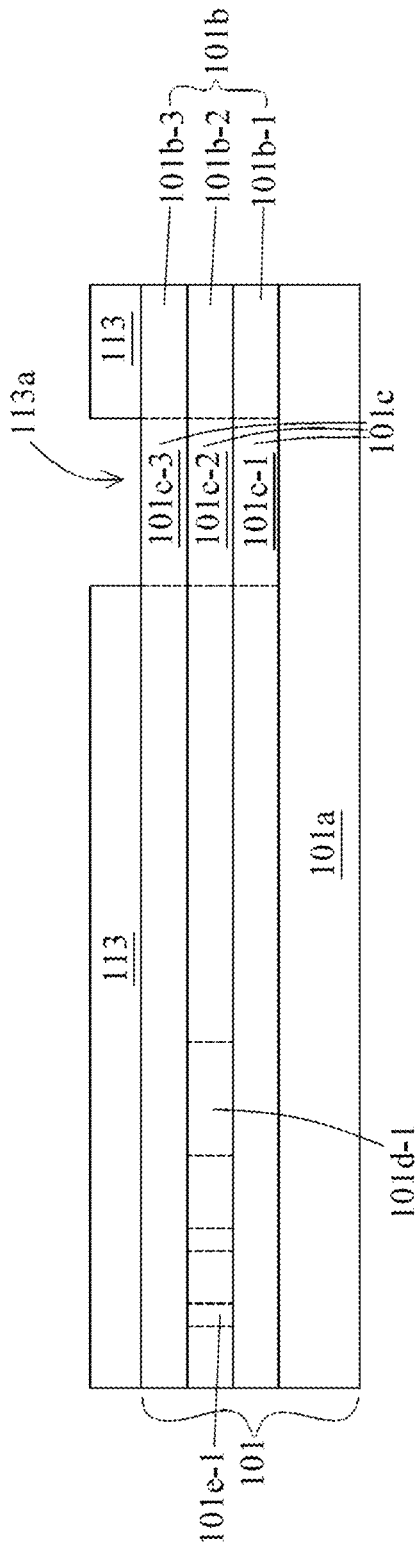
Figure 23:
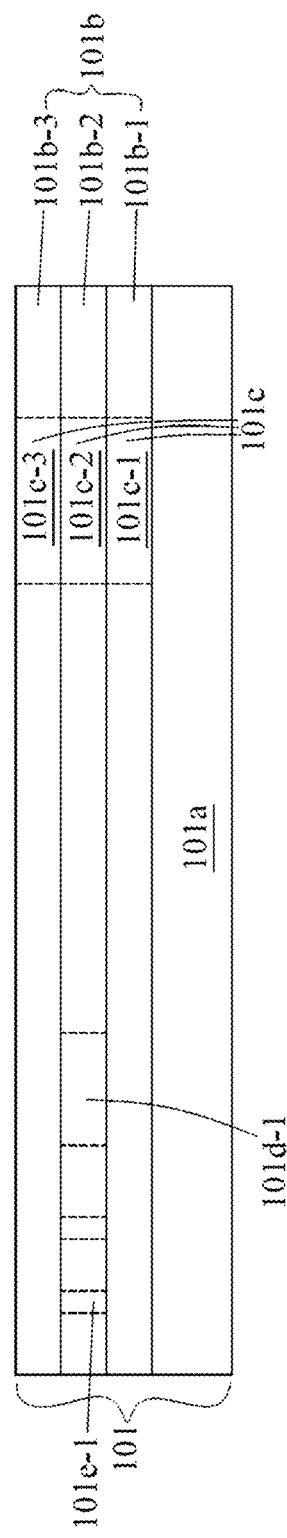

Referring to FIGS. 21 to 23, the manufacturing method may include doping a portion of the third epitaxial sub-layer 101b-3 to form the third doped channel 101c-3. As depicted in FIG. 21, a fourth patterned masking layer 113 is formed on the third epitaxial sub-layer 101b-3 to define the location of the third doped channel 101c-3. In some embodiments, the fourth patterned masking layer 113 may include materials such as photoresist or oxides. The fourth patterned masking layer 113 has a fourth opening 113a, which exposes a portion of the third epitaxial sub-layer 101b-3 for the formation of the third doped channel 101c-3. As shown in FIG. 22, the third doped channel 101c-3 can be formed by diffusion or ion implantation processes carried out from the surface of the third epitaxial sub-layer 101b-3 exposed at the fourth opening 113a. The substrate 101a, the first epitaxial sub-layer 101b-1, the first doped channel 101c-1, the second epitaxial sub-layer 101b-2, the second doped channel 101c-2, the third epitaxial sub-layer 101b-3, and the third doped channel 101c-3 all have the same conductivity type. In some embodiments, doping ions such as phosphorus or arsenic may be injected from the surface of the third epitaxial sub-layer 101b-3 exposed at the fourth opening 113a to form the third doped channel 101c-3. Referring to FIG. 23, the fourth patterned masking layer 113 is removed after the diffusion or ion implantation process. In some embodiments, the fourth patterned masking layer 113 is removed using an etching process, such as plasma dry etching. In some embodiments, the doped channel 101c is formed by a first doping sub-channel 101c-1, a second doping sub-channel 101c-2, and a third doping sub-channel 101c-3. In some embodiments, the doping concentration of the first doping sub-channel 101c-1 is greater than that of the second doping sub-channel 101c-2, and the doping concentration of the second doping sub-channel 101c-2 is greater than that of the third doping sub-channel 101c-3. In some embodiments, the first doping sub-channel 101c-1, the second doping sub-channel 101c-2, and the third doping sub-channel 101c-3 each have substantially the same doping concentration.

Figure 24:
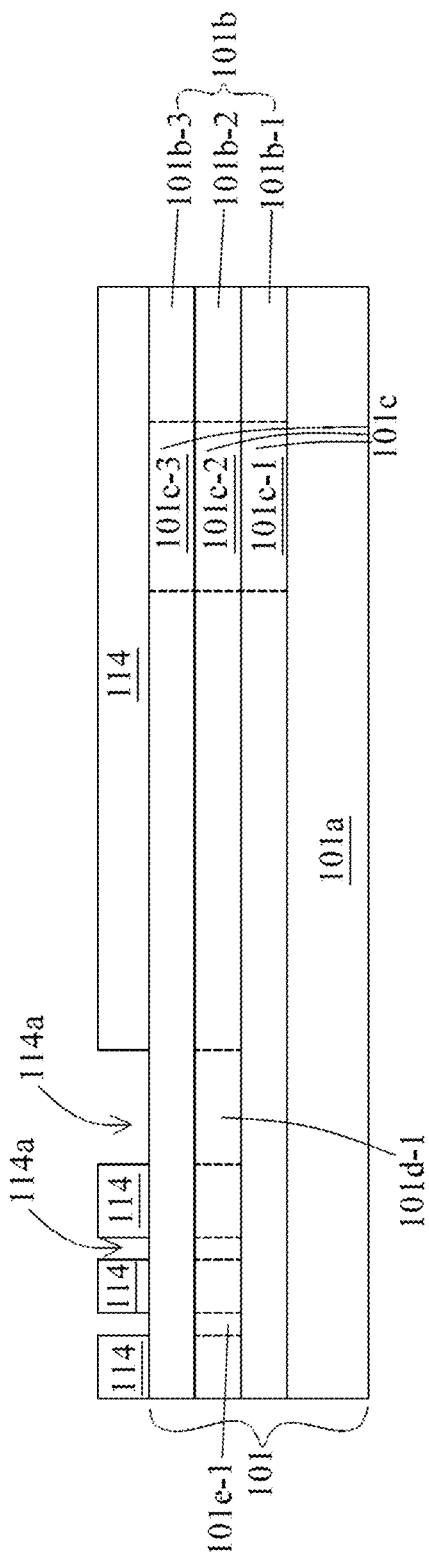
Figure 25:
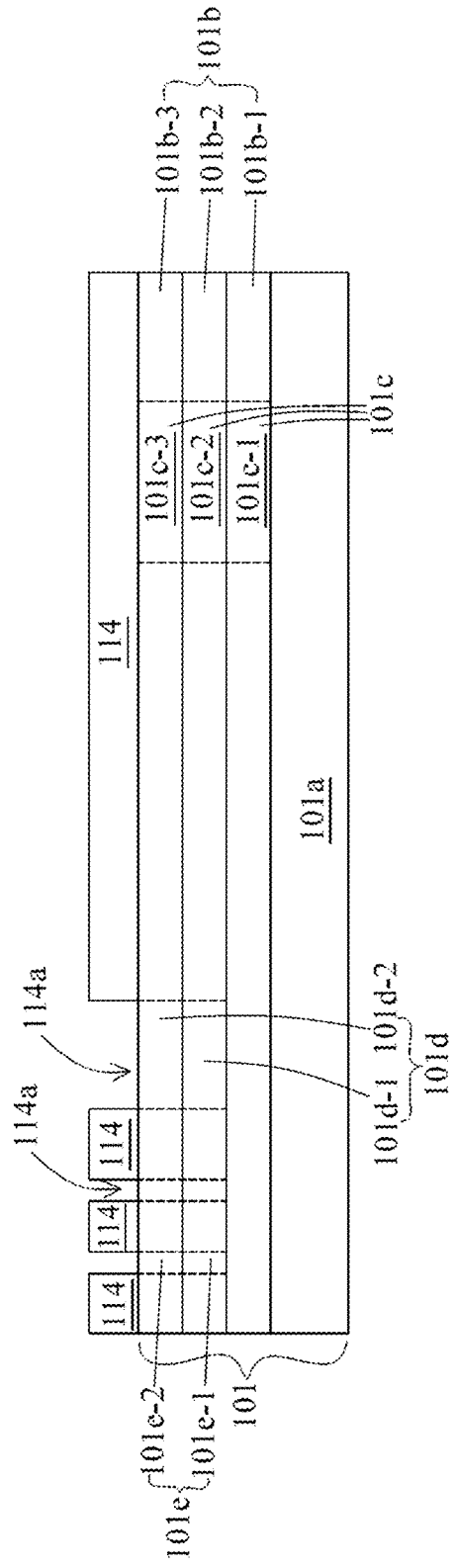
Figure 26:
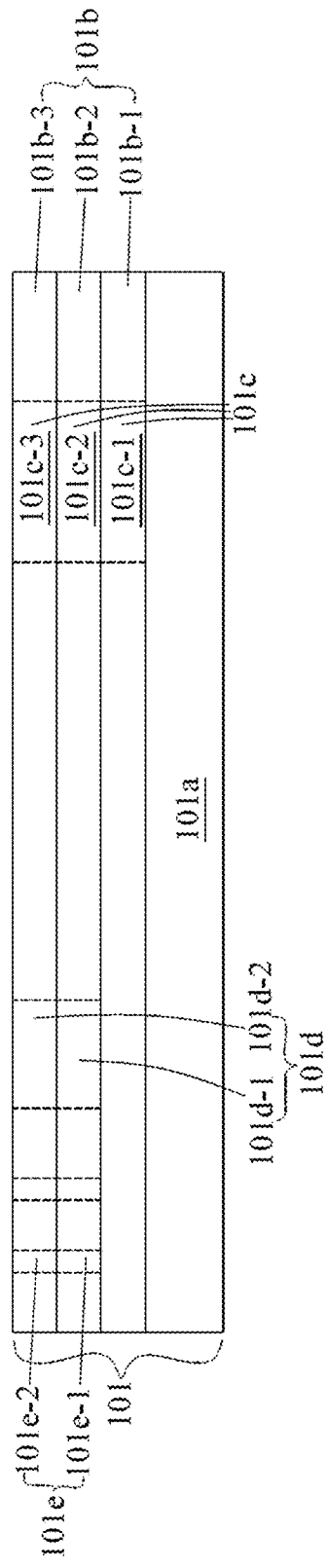

In some embodiments, after the removal of the fourth patterned masking layer 113, as referenced in FIG. 24, a fifth patterned masking layer 114 is formed on the third epitaxial sub-layer 101b-3 to define the locations for the second protective sub-ring 101d-2 and the second doped sub-region 101e-2. The fifth masking layer 114 may include materials such as photoresist or oxides. The fifth masking layer 114 features a fifth opening 114a, which may include multiple sub-openings, through which portions of the third epitaxial sub-layer 101b-3 are exposed for forming the second protective sub-ring 101d-2 and the second doped sub-region 101e-2. As shown in FIG. 25, the second protective sub-ring 101d-2 and the second doped sub-region 101e-2 may be formed by diffusion or ion implantation from the surface of the third epitaxial sub-layer 101b-3, which is exposed by the fifth opening 114a. The first protective sub-rings 101d-1, the second protective sub-rings 101d-2, the first doped sub-regions 101e-1, and the second doped sub-regions 101e-2 are of the same conductivity type, such as p-type. P-type dopants may include, but are not limited to, boron, aluminum, gallium, and indium. In some embodiments, doping ions such as boron ions are injected from the surface of the third epitaxial sub-layer 101b-3, which is exposed through the fifth opening 114a, to form the second protective sub-ring 101d-2 and the second doped sub-region 101e-2. Referring to FIG. 26, following the diffusion or ion implantation process, the fifth patterned masking layer 114 is removed. In some embodiments, the fifth patterned masking layer 114 is removed utilizing an etching process, such as plasma dry etching. In some embodiments, the first protective sub-ring 101d-1 and the second protective sub-ring 101d-2 together constitute the first protective ring 101d, while the first doped sub-region 101e-1 and the second doped sub-region 101e-2 together form the doped region 101e. In some embodiments, the doping concentration of the first doped sub-region 101e-1 is greater than that of the second doped sub-region 101e-2. In various embodiments, the doping concentration of the first protective sub-ring 101d-1 is greater than that of the second protective sub-ring 101d-2.

Figure 27:
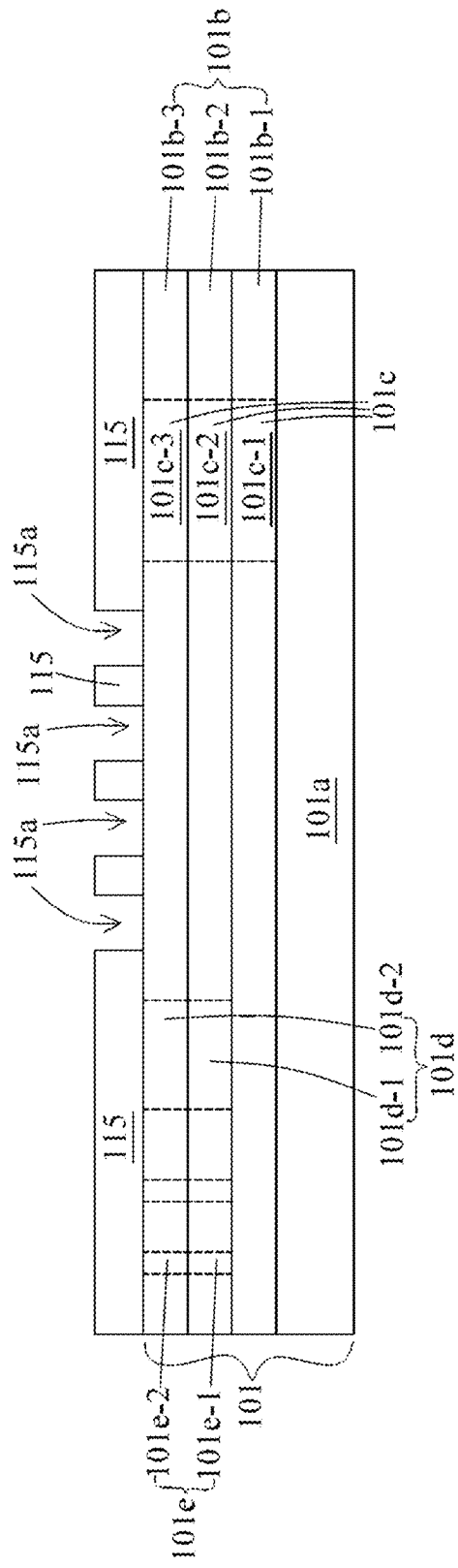
Figure 28:
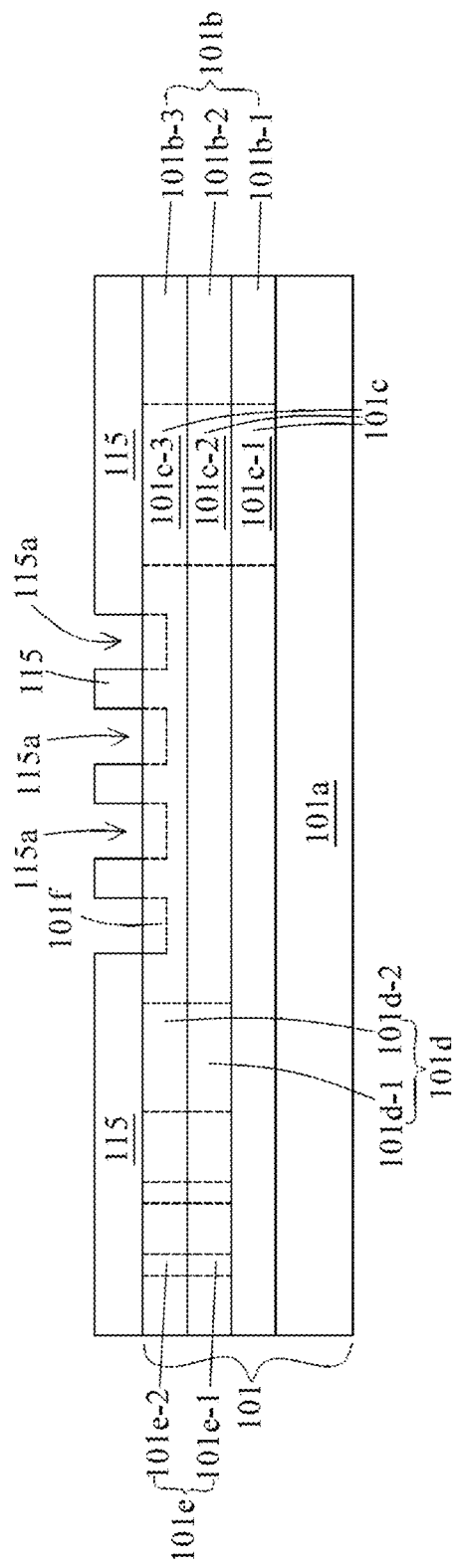
Figure 29:
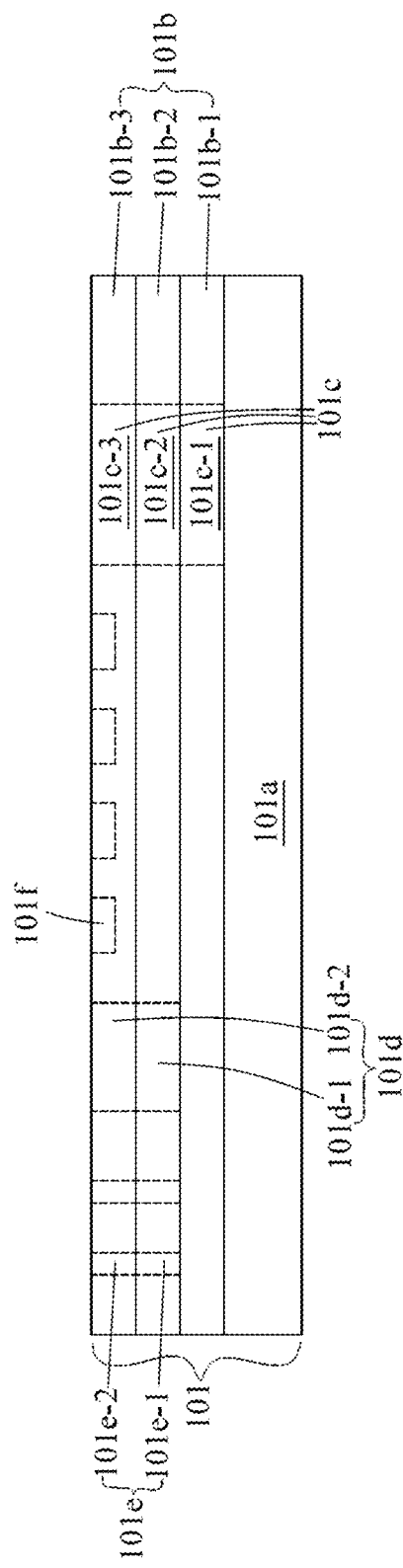

In some embodiments, referring to FIG. 27, after the removal of the fifth patterned masking layer 114, a sixth patterned masking layer 115 is formed on the third epitaxial sub-layer 101b-3 to define the position of the second protective ring 101f. In some embodiments, the sixth patterned masking layer 115 may comprise photoresist or oxide materials. The sixth patterned masking layer 115 features a sixth opening 115a, which may include multiple sub-openings, through which portions of the third epitaxial sub-layer 101b-3 are exposed for forming the second protective ring 101f. As illustrated in FIG. 28, the second protective ring 101f may be formed through diffusion or ion implantation from the surface of the third epitaxial sub-layer 101b-3 exposed through the sixth opening 115a. The first protective sub-ring 101d-1, the second protective sub-ring 101d-2, and the second protective ring 101f share the same conductivity type, for example, all being P-type. P-type dopants may include, but are not limited to, boron, aluminum, gallium, and indium. In some embodiments, dopant ions such as boron ions are implanted from the surface of the third epitaxial sub-layer 101b-3 exposed at the sixth opening 115a to form the second protective ring 101f. Referring to FIG. 29, following the diffusion or ion implantation processes, the sixth patterned masking layer 115 is removed. In some embodiments, the sixth patterned masking layer 115 may be removed by an etching process, such as plasma dry etching. In some embodiments, the doping concentration of the second protective ring 101f is equal to or lower than that of the first protective sub-ring 101d-1. In some embodiments, the height of the second protective ring 101f is substantially equal to or less than the thickness T3 of the third epitaxial sub-layer 101b-3.

Figure 30:
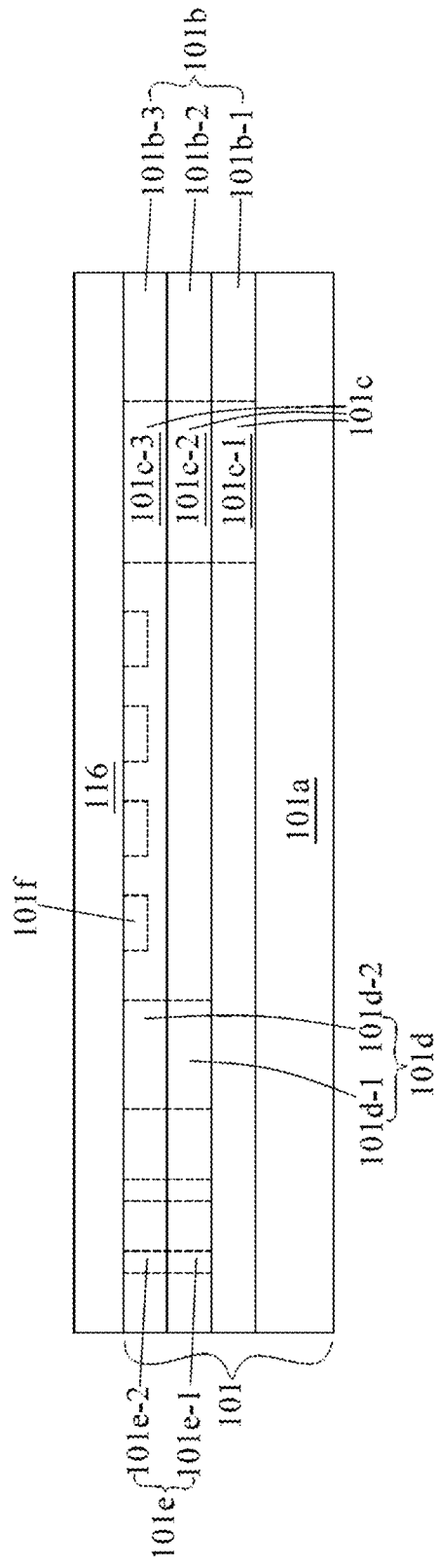
Figure 31:
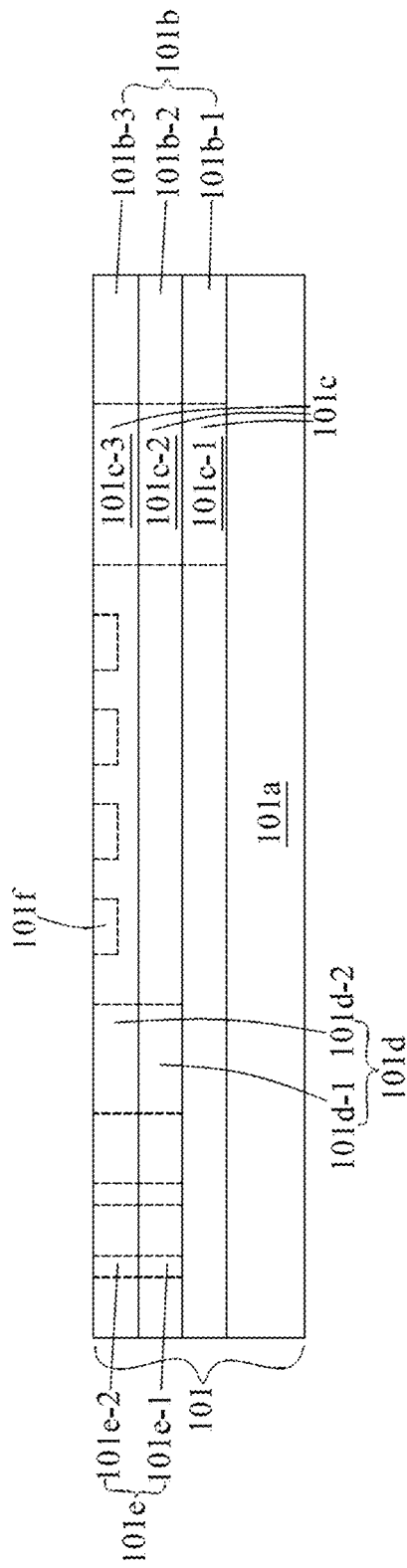

Referring to FIG. 30, following the removal of the sixth patterned masking layer 115, a third protective layer 116 is formed on the third epitaxial sub-layer 101b-3 to protect the third epitaxial sub-layer 101b-3, the second protective sub-ring 101d-2, the second doped sub-region 101e-2, and the third doped channel 101c-3 during the annealing process. After the formation of the third protective layer 116, the second protective sub-ring 101d-2, the second doped sub-region 101e-2, and the third doped channel 101c-3 are subjected to an annealing process, such as rapid thermal annealing (RTA) or laser annealing, to activate the dopant ions within these regions. As shown in FIG. 31, after the annealing process, the third protective layer 116 may be removed by an etching process, such as plasma dry etching.

Figure 32:
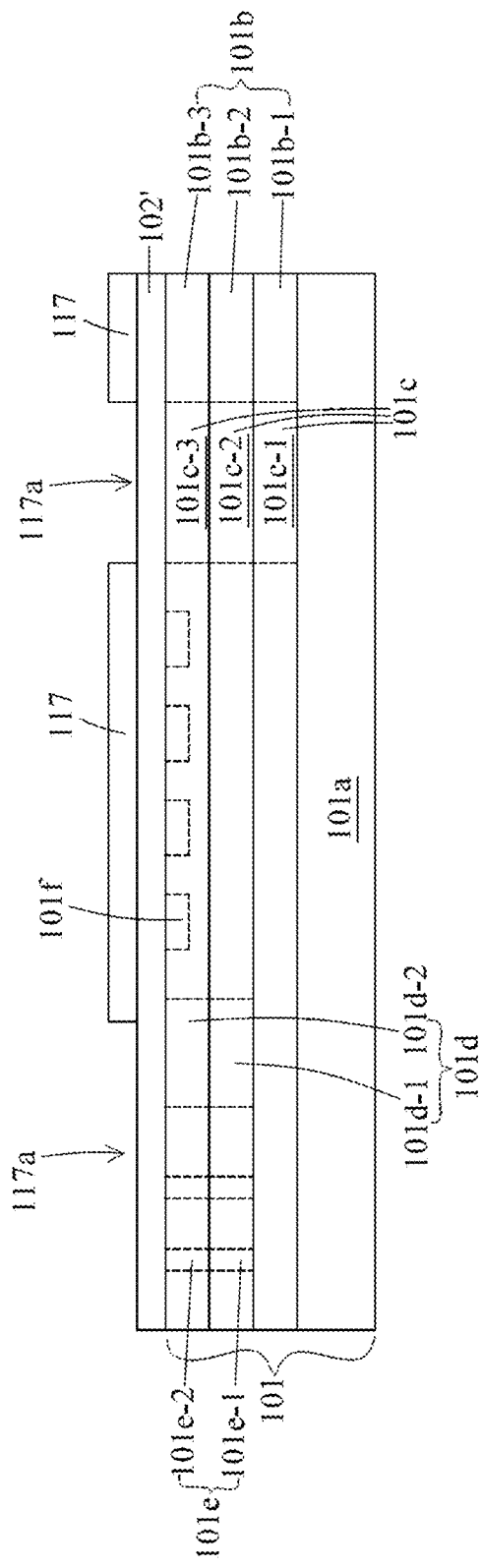
Figure 33:
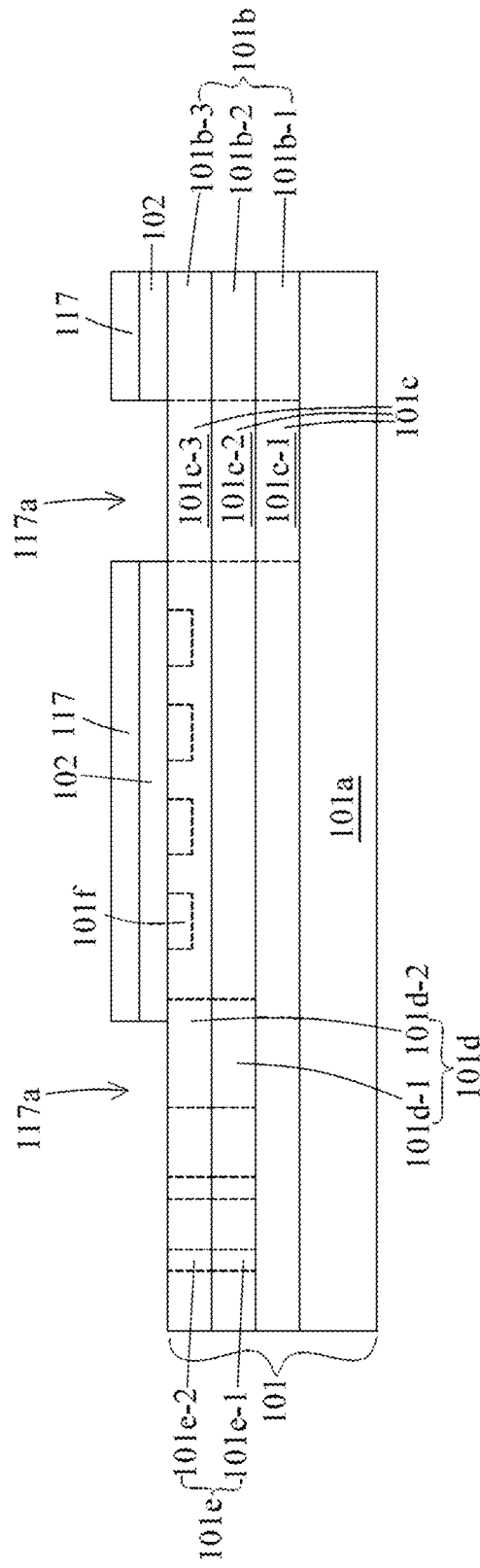
Figure 34:
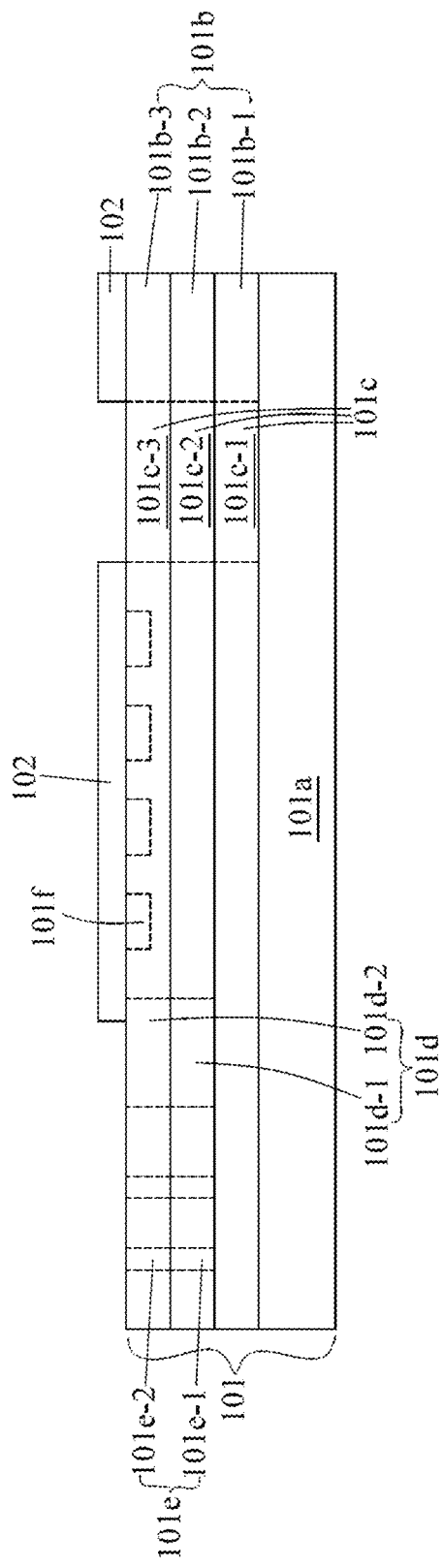

In some embodiments, as referenced from FIGS. 32 to 34, a dielectric layer 102 is formed above the epitaxial layer 101b. As depicted in FIG. 32, dielectric material 102' (not shown in figures) covers the epitaxial layer 101b, and a seventh patterned masking layer 117 is formed on the dielectric material 102'. In some embodiments, the dielectric material 102' is formed using thermal oxidation or other deposition techniques. The dielectric material 102' may include oxides. In some embodiments, the seventh patterned masking layer 117 may comprise photoresist. The seventh patterned masking layer 117 features a seventh opening 117a, which may include multiple sub-openings, through which portions of the dielectric material 102' are exposed. As shown in FIG. 33, the exposed portions of the dielectric material 102' are removed to form the dielectric layer 102. In some embodiments, the dielectric layer 102 is a field oxide. Following the formation of the dielectric layer 102, as illustrated in FIG. 34, the seventh patterned masking layer 117 is removed. In some embodiments, the seventh patterned masking layer 117 is removed by an etching process, such as plasma dry etching.

Figure 35:
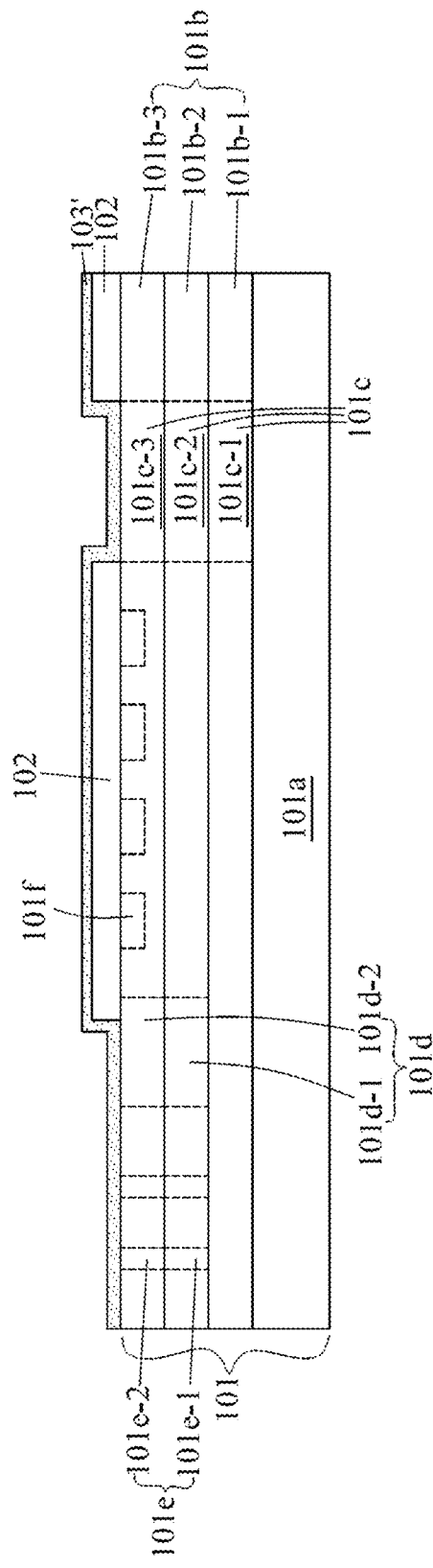
Figure 36:
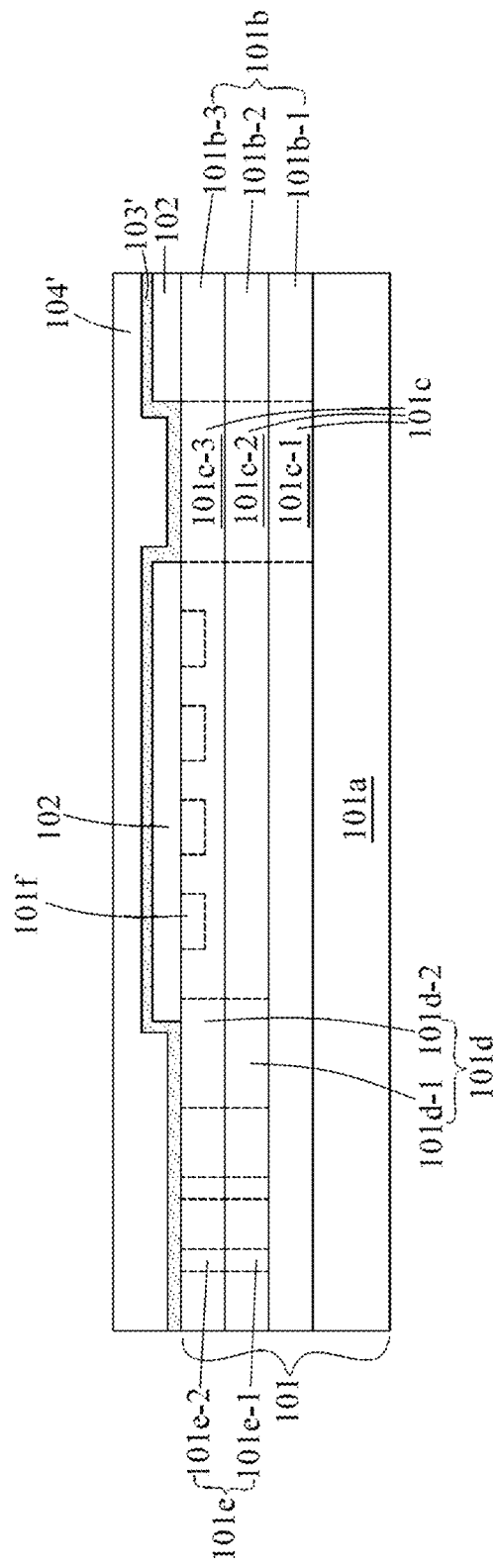
Figure 37:
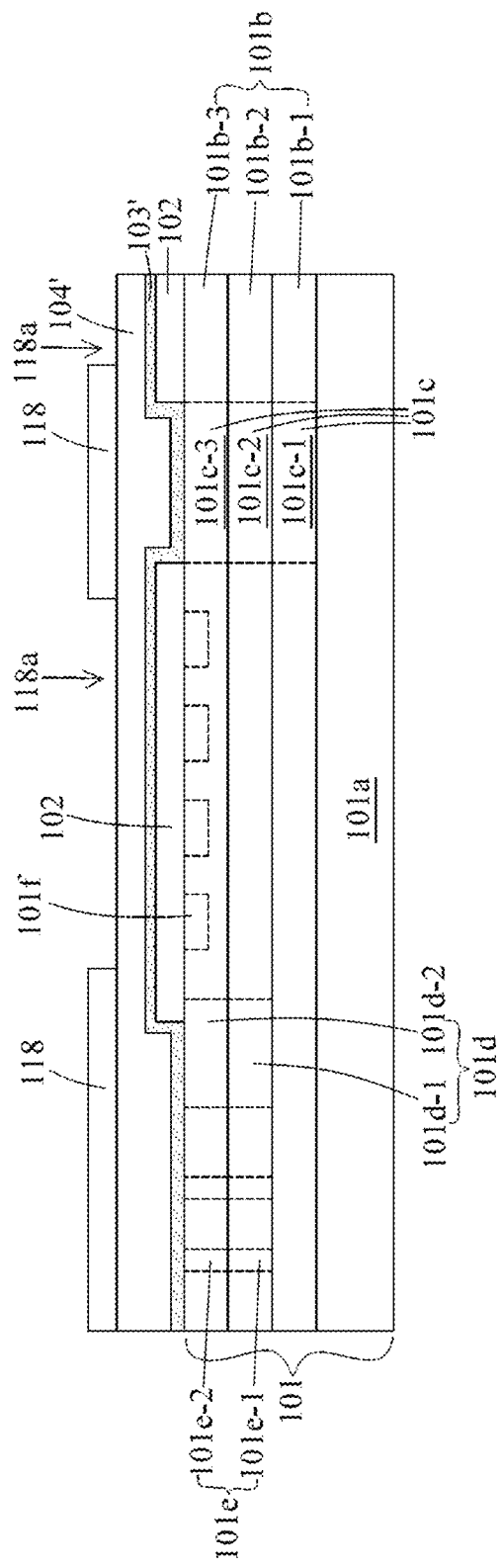

In some embodiments, as depicted in FIGS. 35 to 39, a contact layer 103 and electrodes 104 are formed above the epitaxial layer 101b. In some embodiments, on the third epitaxial sub-layer 101b-3, a junction layer 103a, a barrier layer 103b, a first electrode 104a, and a second electrode 104b are formed, which are partially enclosed by dielectric layer 102. Referring to FIG. 35, contact layer material 103' covers the epitaxial layer 101b and dielectric layer 102. In some embodiments, the contact layer material 103' is deposited using plating, chemical vapor deposition (CVD), or other deposition techniques onto the epitaxial layer 101b and dielectric layer 102. In some embodiments, the contact layer material 103' may include metallic materials such as aluminum (Al), copper (Cu), titanium (Ti), nickel (Ni), tungsten (W), molybdenum (Mo), platinum (Pt), gold (Au), and others. As shown in FIG. 36, electrode material 104' covers the contact layer material 103'. In some embodiments, the electrode material 104' is deposited using plating, chemical vapor deposition (CVD), or other deposition methods onto the contact layer material 103'. In some embodiments, the electrode material 104' may comprise conductive materials, including metals such as copper (Cu), silver (Ag), gold (Au), and others. Following the deposition, as illustrated in FIG. 37, an eighth patterned masking layer 118 is formed on the electrode material 104'. In some embodiments, the eighth patterned masking layer 118 may include photoresist. The eighth patterned masking layer 118 features an eighth opening 118a, which may include multiple sub-openings, through which portions of the electrode material 104' are exposed.

Figure 38:
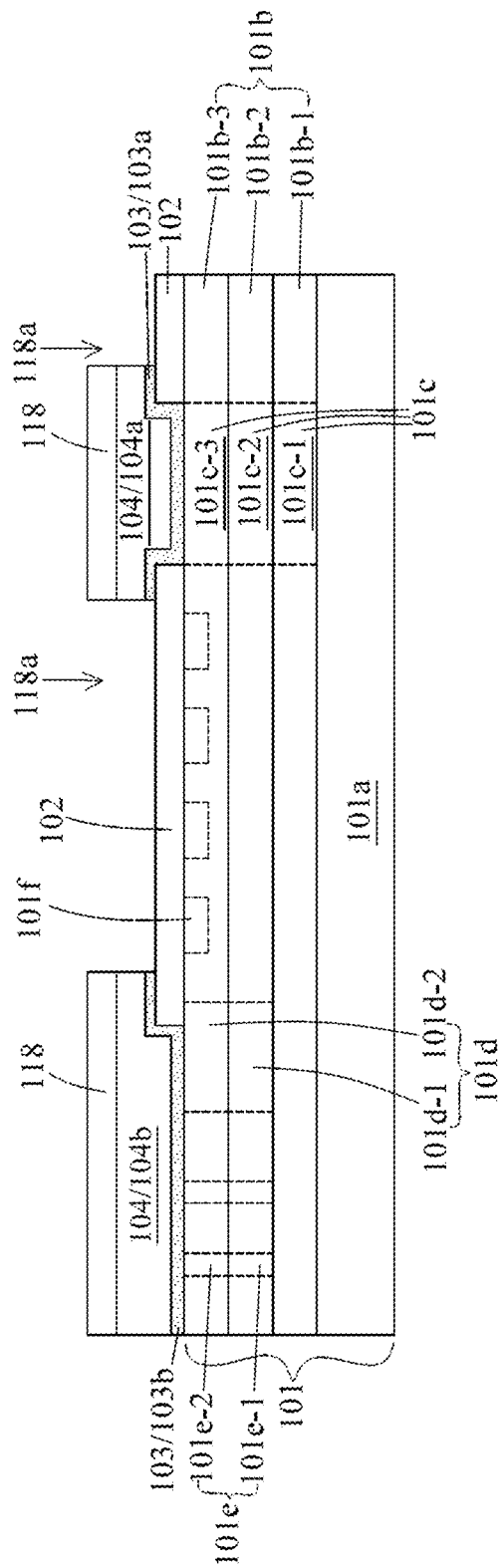
Figure 39:
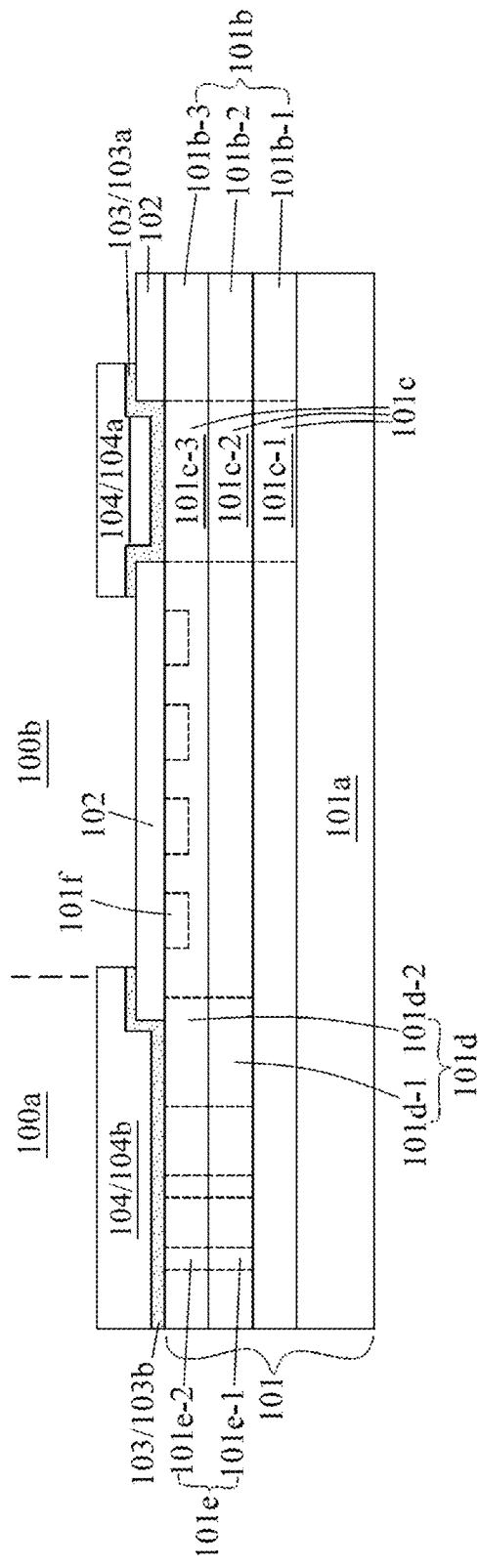

Referring to FIG. 38, portions of the electrode material 104' exposed through the eighth opening 118a, along with portions of the contact layer material 103' exposed by the subsequent removal of electrode material 104', result in the formation of the contact layer 103 and electrodes 104. In some embodiments, the exposed portions of the electrode material 104' and the contact layer material 103', revealed by the subsequent removal of electrode material 104', undergo an etching process to remove these exposed sections. In some embodiments, the contact layer 103 formed may include a junction layer 103a and a barrier layer 103b, and the electrodes 104 formed may include a first electrode 104a and a second electrode 104b. In some embodiments, within the peripheral area 100b and above the doped channel 101c, the junction layer 103a is formed and above which the first electrode 104a is formed. In some embodiments, within the unit area 100a and above the doped area 101e and protective ring 101d, the barrier layer 103b is formed and above which the second electrode 104b is formed. In some embodiments, the doped channel 101c extends between the junction layer 103a and the substrate 101a. As shown in FIG. 39, after the formation of the contact layer 103 and electrodes 104, the eighth patterned masking layer 118 is removed. In some embodiments, the eighth patterned masking layer 118 is removed using an etching process such as plasma dry etching.

Figure 40:
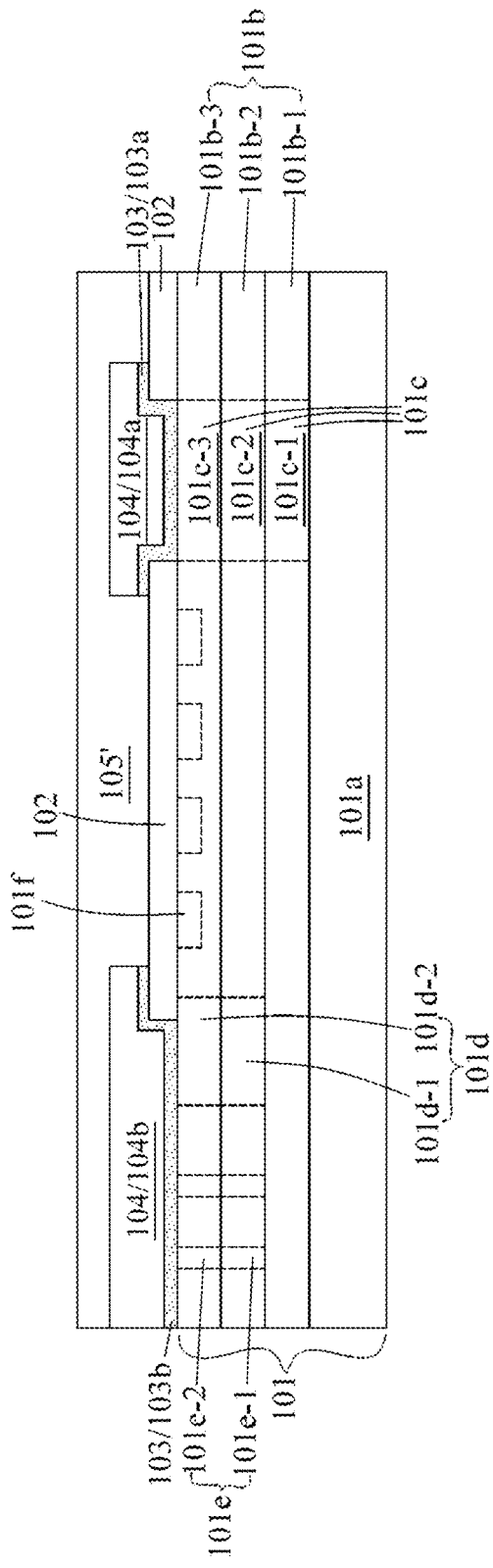
Figure 41:
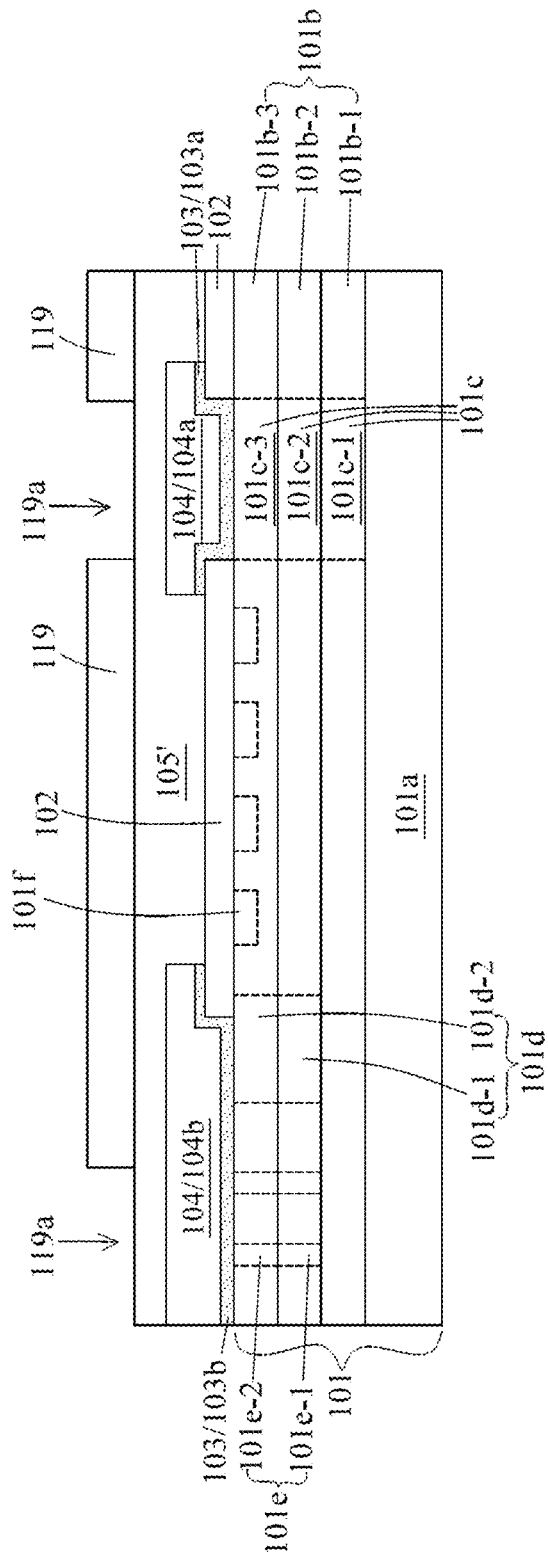
Figure 42:
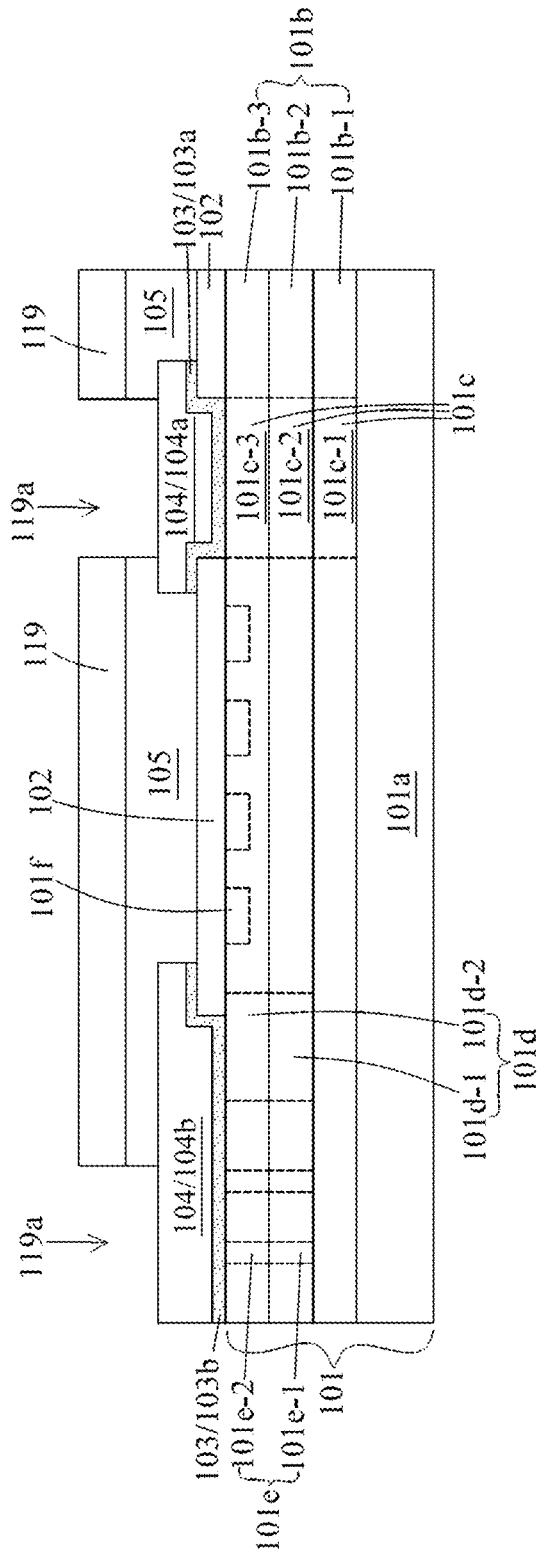
Figure 43:
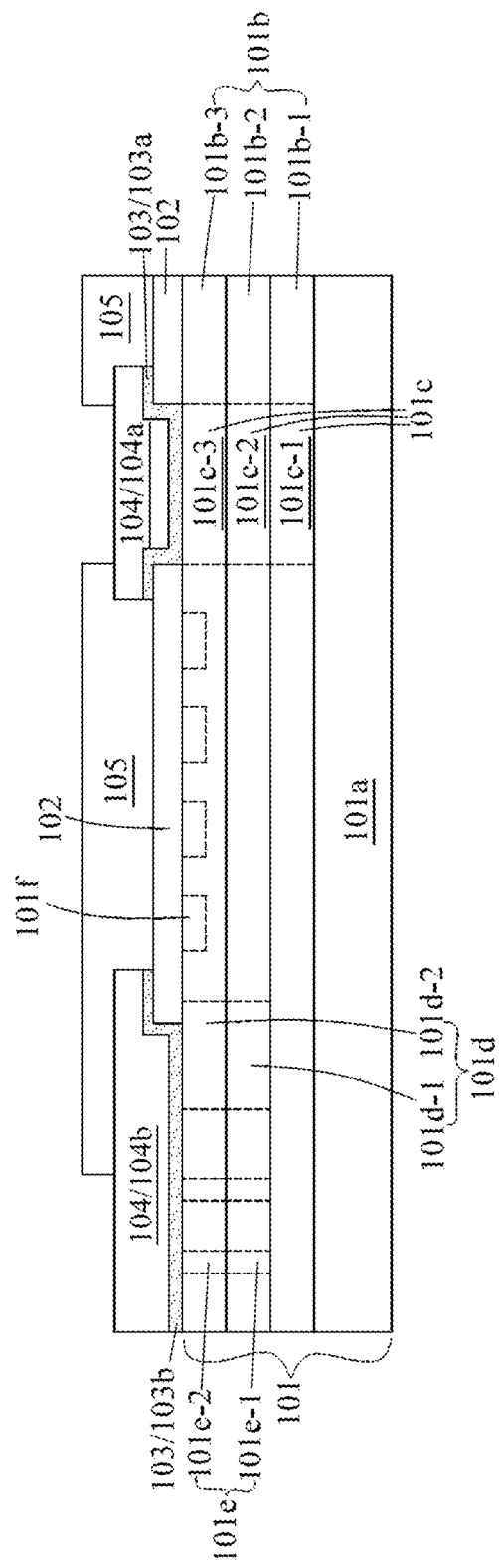

In some embodiments, as depicted in FIGS. 40 to 43, a passivation layer 105 is formed over the dielectric layer 102, the first electrode 104a, and the second electrode 104b. Referring to FIG. 40, the passivation layer material 105' coats the dielectric layer 102, the first electrode 104a, and the second electrode 104b. In some embodiments, the passivation layer material 105' is applied over the dielectric layer 102, the first electrode 104a, and the second electrode 104b using deposition techniques or other methods. In some embodiments, the passivation layer material 105' may include insulating materials such as polymers, polyimides (PI), oxides, nitrides, and oxynitrides. Referring to FIG. 41, after the passivation layer material 105' has been applied, a ninth patterned masking layer 119 is formed on the passivation layer material 105'. In some embodiments, this ninth patterned masking layer 119 may include photoresist material. The ninth patterned masking layer 119 features a ninth opening 119a, which may include multiple sub-openings, through which portions of the passivation layer material 105' are exposed. As shown in FIG. 42, portions of the exposed passivation layer material 105' are removed, creating the passivation layer 105. In some embodiments, the exposed portion of the passivation layer material 105' undergoes an etching process to remove this portion. In some embodiments, at least a portion of the first electrode 104a and the second electrode 104b are exposed by the passivation layer 105. The dielectric layer 102 and passivation layer 105 separate ate the junction layer 103a and the first electrode 104a from the barrier layer 103b and the second electrode 104b. Referring to FIG. 43, after the formation of the passivation layer 105, the ninth patterned masking layer 119 is removed. In some embodiments, the ninth patterned masking layer 119 is removed using an etching process such as plasma dry etching.

Figure 44:
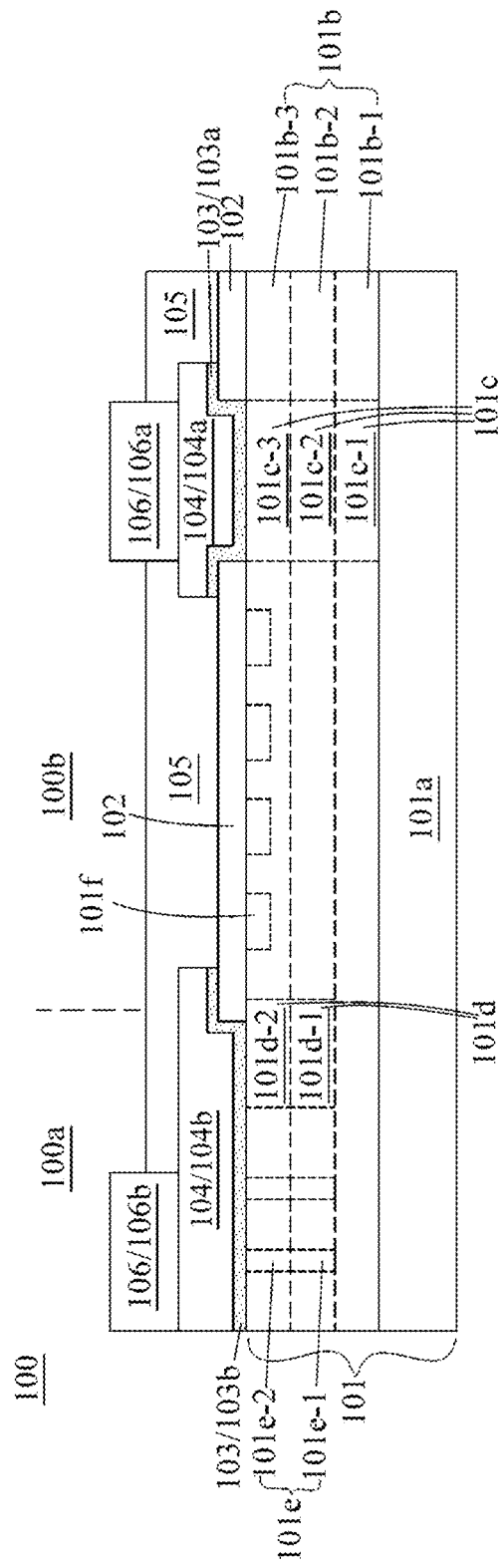

In some embodiments, as referenced in FIG. 44, multiple conductive bumps 106 are formed above the electrode 104. In some embodiments, these conductive bumps 106 include conductive materials such as tin, lead, silver, copper, and nickel. In some embodiments, these conductive bumps 106 may take forms such as solder balls or tin balls. In some embodiments, multiple conductive bumps 106 comprise a first conductive bump 106a and a second conductive bump 106b. The first conductive bump 106a is situated within the peripheral region 100b above the first electrode 104a, while the second conductive bump 106b is located within the cell region 100a and above the second electrode 104b. In some embodiments, the first conductive bump 106a is formed over at least a portion of the first electrode 104a that is exposed by the passivation layer 105, and similarly, the second conductive bump 106b is formed over at least a portion of the second electrode 104b that is exposed by the passivation layer 105. The passivation layer 105 serves to electrically separate the first conductive bump 106a from the second conductive bump 106b. As illustrated in FIG. 44, this configuration results in a power semiconductor device 100 as depicted in FIG. 1. In some embodiments, the power semiconductor device 100 may not include multiple conductive bumps 106; for example, the multiple conductive bumps 106 may be replaced by wire bonds that contact the electrodes 104.

FIGS. 4 to 5, 45 to 48, 11 to 43, and 49 depict one or more various stages in the manufacturing process of the power semiconductor device 200, according to some embodiments of this disclosure.

Figure 47:
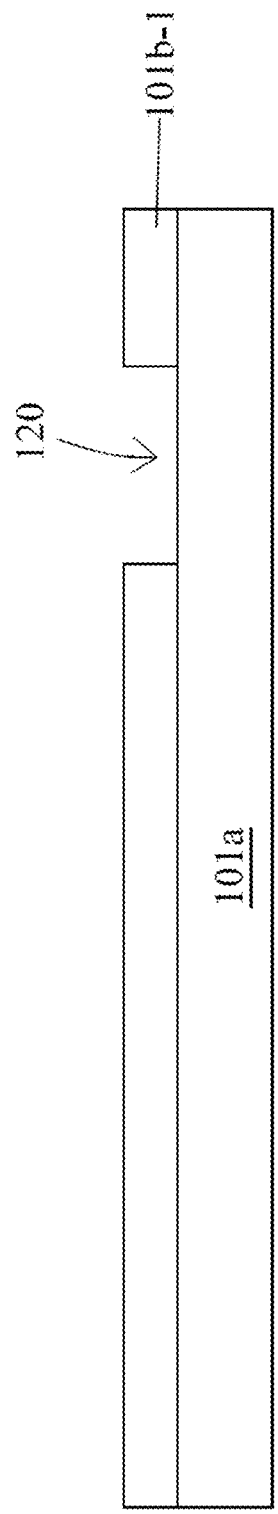
Figure 48:
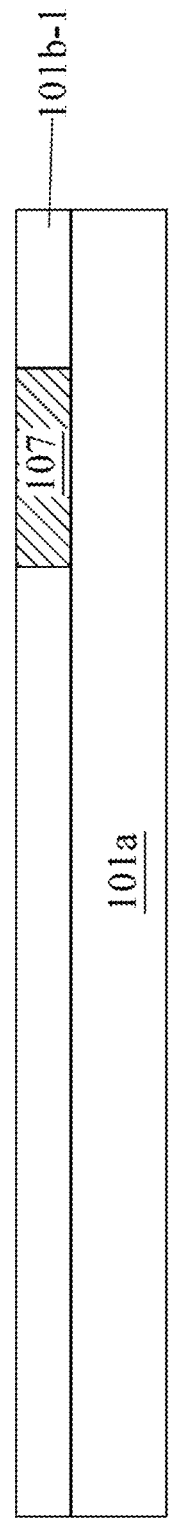
Figure 49:
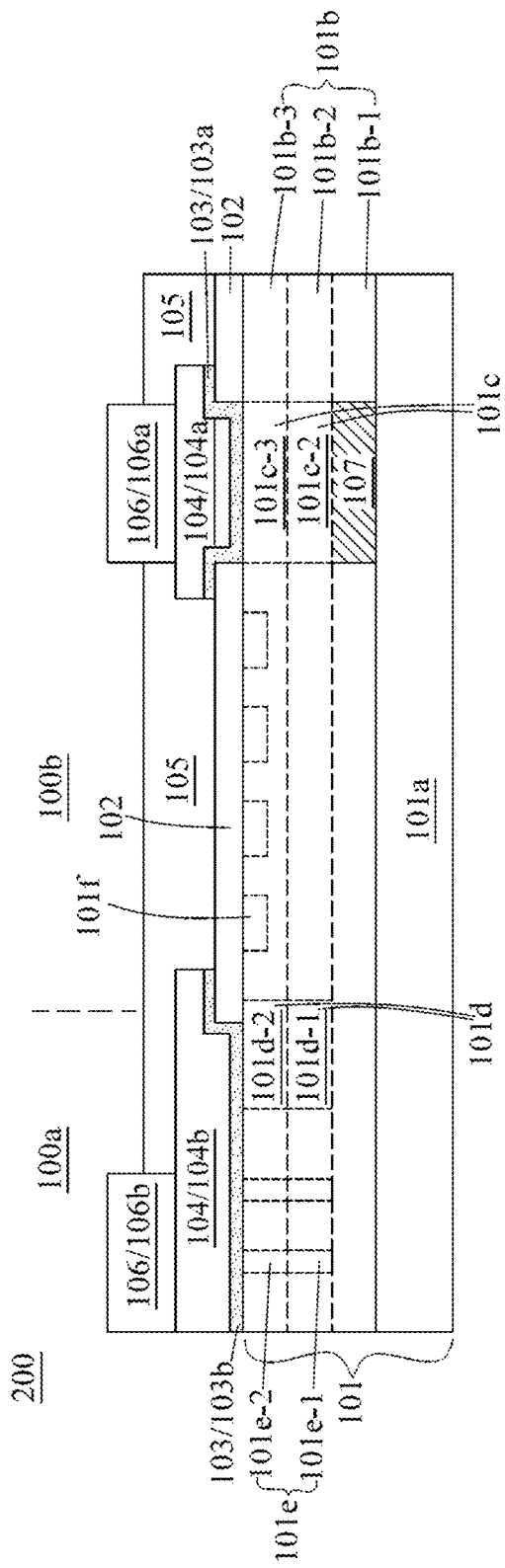

As referenced in FIGS. 4 to 5, the manufacturing of power semiconductor device 200 may include forming a first epitaxial layer 101b-1 on the substrate 101a. The epitaxial growth on substrate 101a results in the formation of the first epitaxial layer 101b-1. Referring to FIG. 45, following the formation of the first epitaxial layer 101b-1, a first patterned masking layer 108 is formed on the first epitaxial layer 101b-1 to define the locations for subsequent semiconductor component 107. In some embodiments, the first patterned masking layer 108 includes the first opening 108a, which exposes a portion of the first epitaxial layer 101b-1. As depicted in FIG. 46, a portion of the exposed first epitaxial layer 101b-1 is removed to create the tenth opening 120, exposing a portion of the substrate 101a. In some embodiments, the exposed portion of the first epitaxial layer 101b-1 is removed by an etching process. Following the formation of the tenth opening 120, as shown in FIG. 47, the first patterned masking layer 108 is removed. In some embodiments, the first patterned masking layer 108 is removed by an etching process such as plasma dry etching. As referenced in FIG. 48, the tenth opening 120 is filled with semiconductor material to form semiconductor component 107. The semiconductor component 107 may be formed using methods such as sputtering, physical vapor deposition (PVD), or other deposition techniques. In some embodiments, the semiconductor component 107 includes semiconductor materials such as polycrystalline silicon. Following the formation of the semiconductor component 107, the steps shown in FIGS. 11 to 43 are performed. After these steps, as depicted in FIG. 49, the power semiconductor device 200 as shown in FIG. 2 is formed. The semiconductor component 107 is located between the substrate 101a and the doped channel 101c, surrounded by the substrate 101a and the epitaxial layer 101b, and extends through a portion of the epitaxial layer 101b. The semiconductor component 107 is located within the peripheral area 100b, with the doped channel 101c extending between the junction layer 103a and the semiconductor component 107.

FIGS. 4 to 5, 50 to 53, 11 to 43, and 54 illustrate one or more stages in the manufacturing process of the power semiconductor device 300 according to various embodiments in this disclosure.

Figure 52:
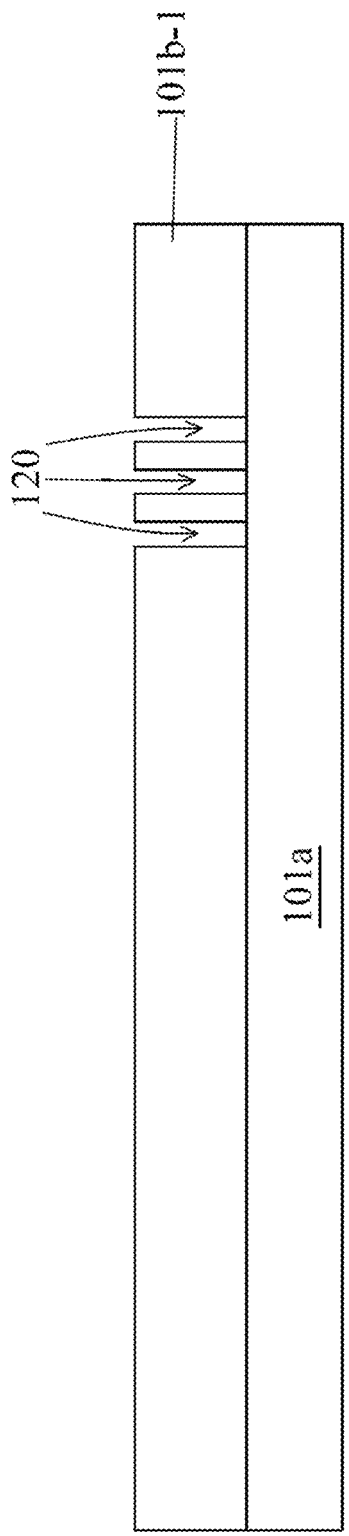
Figure 53:
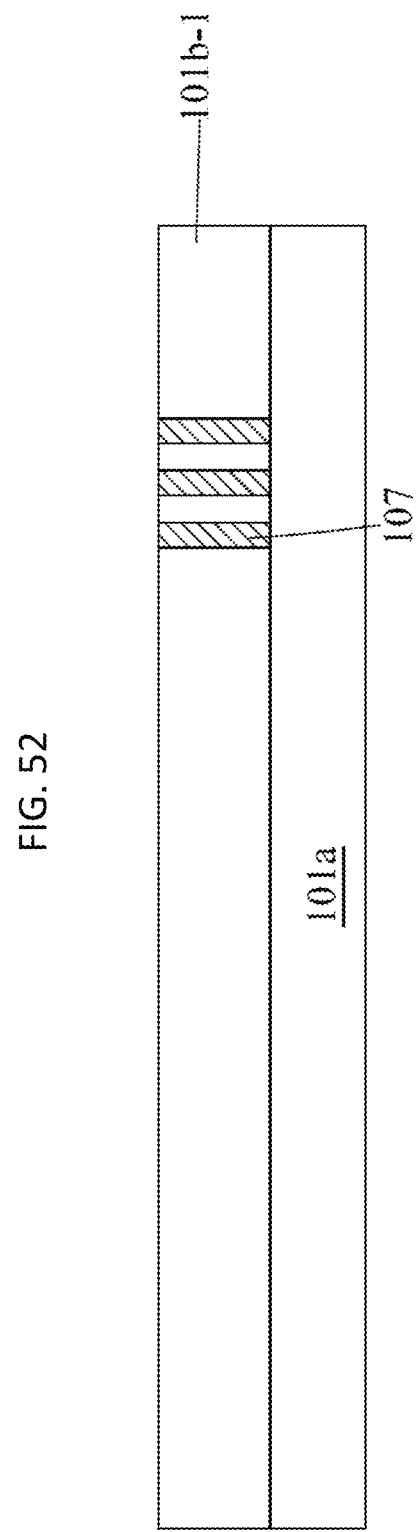
Figure 54:
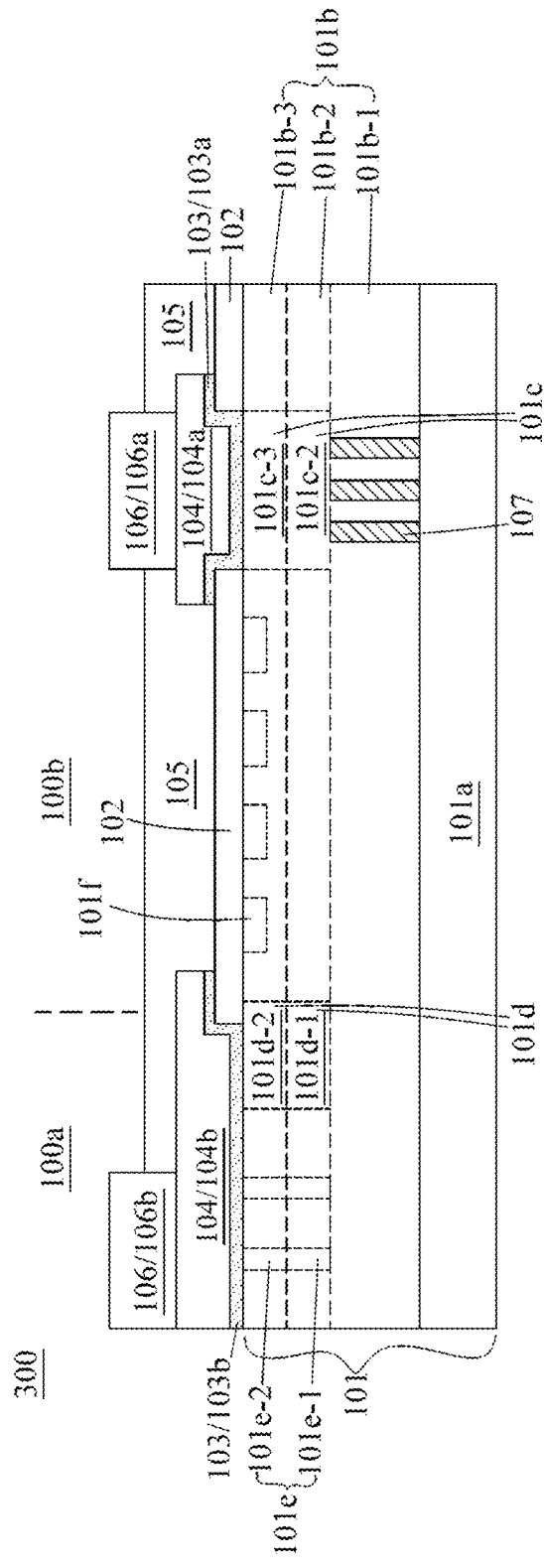

As illustrated in FIGS. 4 to 5, the manufacturing process for power semiconductor device 300 may include forming a first epitaxial layer 101b-1 above the substrate 101a. Following the epitaxial growth on substrate 101a, which forms the first epitaxial layer 101b-1, as referenced in FIG. 50, a first patterned masking layer 108 is formed on the first epitaxial layer 101b-1 to define the locations for various semiconductor components 107. In some embodiments, the first patterned masking layer 108 may include multiple first openings 108a, through which various portions of the first epitaxial layer 101b-1 are exposed. As shown in FIG. 51, the exposed portions of the first epitaxial layer 101b-1 are removed, forming multiple tenth openings 120, which expose multiple portions of the substrate 101a. In some embodiments, the exposed portions of the first epitaxial layer 101b-1 are removed by an etching process. After forming the multiple tenth openings 120, as depicted in FIG. 52, the first patterned masking layer 108 is removed. In some embodiments, the first patterned masking layer 108 may be removed by an etching process such as plasma dry etching. As illustrated in FIG. 53, the multiple tenth openings 120 are filled with semiconductor material to form the various semiconductor components 107. These semiconductor components may be formed using methods such as sputtering, physical vapor deposition (PVD), or other deposition techniques. In some embodiments, each of the semiconductor components 107 includes semiconductor materials such as polycrystalline silicon. Following the formation of the various semiconductor components 107, the steps shown in FIGS. 11 to 43 are performed. After these steps, as depicted in FIG. 54, the power semiconductor device 300 as shown in FIG. 3 is formed. The semiconductor components 107 are located between the substrate 101a and the doped channel 101c, surrounded by the substrate 101a and the epitaxial layer 101b, with each component extending through a part of the epitaxial layer 101b. Each of the semiconductor components 107 is located within the peripheral area 100b, with the doped channel 101c extending between the junction layer 103a and the various semiconductor components 107.

In accordance with the structures and methods disclosed herein, under the same objectives and concepts, the steps in the aforementioned processes may be adjusted or their sequence altered to achieve identical or similar semiconductor structures.

The following provides further embodiments. The power semiconductor device comprises a base that includes a substrate and an epitaxial layer located above the substrate, with the base comprising a unit area and a peripheral area surrounding the unit area. A junction layer is located within the peripheral area and above the epitaxial layer. A barrier layer is located within the unit area and above the epitaxial layer. A first electrode is located on the junction layer and a second electrode is located on the barrier layer. The epitaxial layer includes a doped channel located within the peripheral area, extending between the junction layer and the substrate. Current flows from the substrate through the doped channel and the junction layer to the first electrode.

In certain embodiments of the power semiconductor device, the height of the doped channel and the thickness of the epitaxial layer range from approximately 2 µm to 6 µm.

In certain embodiments of the power semiconductor device, the substrate comprises silicon carbide (SiC).

In certain embodiments of the power semiconductor device, the substrate and the doped channel have same conductivity type.

In certain embodiments of the power semiconductor device, the junction layer is ohmic or non-ohmic, and the barrier layer is non-ohmic.

The power semiconductor device of further comprises a dielectric layer located above the epitaxial layer and at least partially surrounding the junction layer and the barrier layer. A passivation layer located on the dielectric layer, the first electrode, and the second electrode. A plurality of conductive bumps respectively located on the first electrode or the second electrode. The junction layer and the first electrode are separated from the barrier layer and the second electrode by the dielectric layer and the passivation layer.

In this disclosure, spatial relative terms such as "below," "beneath," "lower," "above," "upper," "left," "right," "on", etc., are used to describe the relationships between one component or feature and one or more other components or features as depicted in the figures. Aside from the orientations depicted in the figures, these spatial relative terms are also intended to cover different operational orientations of the device. The device can be oriented in other ways (e.g., rotated 90 degrees or placed in other orientations), and the spatial relative descriptions used herein are intended to be interpreted correspondingly. It should be understood that when a component is said to be "connected to" or "coupled to" another component, it can be directly connected or coupled to the other component, or intervening components may be present.

As used herein, terms like "approximately," "substantially," and "about" are used to describe and account for small variations. When used in conjunction with an event or circumstance, these terms can refer to the precise occurrence of the event or circumstance as well as instances that are close to such occurrence. As used herein concerning given values or ranges, the term "about" generally means within ±10%, ±5%, ±1%, or ±0.5% of a given value or range. Ranges can be expressed as from one endpoint to another endpoint, or encompassing everything between two endpoints. All ranges disclosed herein include their endpoints unless otherwise specified. The term "substantially coplanar" may refer to two surfaces that are positioned along the same plane with a positional difference of a few micrometers (μm), such as within 10 μm, 5 μm, 1 μm, or 0.5 μm. When numerical values or characteristics are described as "substantially" the same, the terms may denote values within ±10%, 5%, ±1%, or ±0.5% of the stated average value.

The foregoing content outlines several embodiments' features and the detailed aspects of this disclosure. The embodiments described herein can readily serve as the basis for designing or modifying other processes and structures to achieve similar purposes or to attain the advantages introduced by the embodiments discussed.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A power semiconductor device, comprising:
   a base comprising a substrate and an epitaxial layer disposed above the substrate, with the base comprising a unit area and a peripheral area surrounding the unit area;
   a junction layer located within the peripheral area and above the epitaxial layer;
   a barrier layer located within the unit area and above the epitaxial layer;
   a first electrode located on the junction layer; and
   a second electrode located on the barrier layer,
   wherein the epitaxial layer comprises a doped channel located in the peripheral area and extending between the junction layer and the substrate.

2. The power semiconductor device of claim 1, wherein a height of the doped channel is substantially equal to a thickness of the epitaxial layer.

3. The power semiconductor device of claim 1, wherein the epitaxial layer comprises a plurality of epitaxial sub-layers stacked on each other, and the doped channel extends across the plurality of epitaxial sub-layers.

4. The power semiconductor device of claim 3, wherein each of the plurality of epitaxial sub-layers has substantially same thickness.

5. The power semiconductor device of claim 1, wherein the epitaxial layer comprises a doped region located within the unit area and extending between the barrier layer and the substrate.

6. The power semiconductor device of claim 5, wherein the height of the doped region is substantially less than the height of the doped channel.

7. The power semiconductor device of claim 5, wherein a conductivity type of the doped region is opposite to that of the doped channel.

8. A power semiconductor device, comprising:
   a base comprising a substrate and an epitaxial layer disposed above the substrate, with the base comprising a unit area and a peripheral area surrounding the unit area;
   a semiconductor component surrounded by the substrate and the epitaxial layer;
   a junction layer located within the peripheral area and above the epitaxial layer; and
   a first electrode located on the junction layer,
   wherein the epitaxial layer comprises a doped channel located in the peripheral area and extending between the junction layer and the semiconductor component.

9. The power semiconductor device of claim 8, wherein the semiconductor component comprises polysilicon.

10. The power semiconductor device of claim 8, wherein a height of the epitaxial layer is substantially greater than 5 μm.

11. The power semiconductor device of claim 8, wherein a height of the semiconductor component is substantially less than a height of the doped channel.

12. The power semiconductor device of claim 11, the height of the semiconductor component is about 2 μm.

13. The power semiconductor device of claim 8, wherein a portion of the epitaxial layer extends between the doped channel and the substrate and is surrounded by the semiconductor component.

14. The power semiconductor device of claim 8, wherein a height of the semiconductor component is substantially equal to or greater than a height of the doped channel.

15. The power semiconductor device of claim 14, wherein the height of the semiconductor component is substantially greater than 5 μm.

16. A method for manufacturing a power semiconductor device, comprising:
   forming a first epitaxial layer above a substrate;
   implanting doping ions into a portion of the first epitaxial layer to form a first doped channel;
   forming a second epitaxial layer on the first epitaxial layer;
   implanting the doping ions into a portion of the second epitaxial layer to form a second doped channel above the first doped channel;
   forming a junction layer above the second doped channel; and
   forming a first electrode on the junction layer,
   wherein the first and second doped channels extend between the junction layer and the substrate.

17. The method of claim 16, further comprising, prior to forming the first epitaxial layer:
   forming a third epitaxial layer above the substrate;

removing a portion of the third epitaxial layer to create an opening; and filling the opening with semiconductor material to form a semiconductor component.

18. The method of claim 17, wherein the semiconductor component is located between the substrate and the doped channel.

19. The method of claim 17, wherein a thickness of the third epitaxial layer is substantially equal to or greater than a thickness of either the first or the second epitaxial layer.

20. The method of claim 16, further comprising, prior to forming the second epitaxial layer and implanting the doping ions into the portion of the second epitaxial layer, annealing to activate the first doped channel.

* * * * *